US011763062B2

(12) United States Patent
Rittman et al.

(10) Patent No.: US 11,763,062 B2
(45) Date of Patent: Sep. 19, 2023

(54) SYSTEMS AND METHODS FOR ELIMINATING ELECTROMIGRATION AND SELF-HEAT VIOLATIONS IN A MASK LAYOUT BLOCK

(71) Applicant: GBT Technologies Inc., Santa Monica, CA (US)

(72) Inventors: Danny Rittman, San Diego, CA (US); Mo Jacob, Beverly Hills, CA (US)

(73) Assignee: GBT Tokenize Corp., Santa Monica, CA (US)

( * ) Notice: Subject to any disclaimer, the term of this patent is extended or adjusted under 35 U.S.C. 154(b) by 165 days.

(21) Appl. No.: 17/315,747

(22) Filed: May 10, 2021

(65) Prior Publication Data
US 2022/0358278 A1 Nov. 10, 2022

(51) Int. Cl.
*G06F 30/398* (2020.01)
*G06F 30/367* (2020.01)

(52) U.S. Cl.
CPC .......... *G06F 30/398* (2020.01); *G06F 30/367* (2020.01)

(58) Field of Classification Search
CPC .... G06F 30/394; G06F 30/392; G06F 11/261; G06F 30/30; G06F 30/33; G06F 30/39; G06F 2119/06; G06F 30/367; G06F 30/398; G06F 2119/08; G06F 30/20; G06F 30/3312; G06F 30/00; G06F 30/18; G06F 2119/18; G06F 2111/04; G06F 2111/08; G06F 2119/12; G06F 2113/18; G06F 2111/12; G06F 30/327; G06F 30/27; G06F 30/323; G06F 30/396; G03F 1/36; G03F 1/00; G03F 1/68; G03F 1/78; G03F 1/70; G03F 1/38; G03F 7/70441; G03F 7/705; G03F 7/70433; G03F 7/70666; G03F 1/76; H01L 23/528; H01L 27/0207; H01L 2924/00; H01L 27/0922; H01L 2924/00014
(Continued)

(56) References Cited
U.S. PATENT DOCUMENTS 5,541,025 A   7/1996  Oi et al.
5,761,075 A   6/1998  Oi et al.
(Continued)

*Primary Examiner* — Binh C Tat
(74) *Attorney, Agent, or Firm* — Eric L. Lane; Green Patent Law

(57) ABSTRACT

Computer-implemented systems and methods for improving construction of a mask layout block, for eliminating electromigration and self-heat violations during construction of a mask layout block, and for maintaining process design rules and layout connectivity during construction of a mask layout block are provided. At least one selected polygon is analyzed and a selected position of the selected polygon determined. The systems and methods obtain one or more electromigration rules or self-heat rules associated with the selected polygon. An information window with the one or more electromigration or self-heat rules and a violation marker associated with the selected position of the selected polygon are provided. The system determines if the selected position of the selected polygon or a length or width of the selected polygon violates an electromigration rule or self-heat rule. The violation marker prevents creating, placing, and editing the selected polygon if the selected position would violate at least one of the one or more electromigration rules or self-heat rules.

20 Claims, 23 Drawing Sheets

(58) Field of Classification Search
USPC .................................................. 716/50–56
See application file for complete search history.

(56) References Cited

U.S. PATENT DOCUMENTS

| | | |
|---|---|---|
| 6,457,163 B1 | 9/2002 | Yang |
| 6,782,517 B2 | 8/2004 | Rittman et al. |
| 6,782,524 B2 | 8/2004 | Rittman |
| 6,904,582 B1 | 6/2005 | Rittman et al. |
| 6,978,437 B1 | 12/2005 | Rittman et al. |
| 7,178,114 B2 | 2/2007 | Lin et al. |
| 7,519,940 B2 | 4/2009 | Huang et al. |
| 7,537,864 B2 | 5/2009 | Fujimoto et al. |
| 7,568,174 B2 | 7/2009 | Sezginer et al. |
| 7,600,212 B2 | 10/2009 | Zach et al. |
| 7,849,423 B1 | 12/2010 | Yenikaya et al. |
| 8,572,517 B2 | 10/2013 | Pramanik et al. |
| 8,940,462 B2 | 1/2015 | Hashimoto et al. |
| 9,292,627 B2 | 3/2016 | Pramanik et al. |
| 9,372,855 B1 | 6/2016 | Lee et al. |
| 9,836,556 B2 | 12/2017 | Lei et al. |
| 10,755,026 B1 | 8/2020 | Luo |
| 2002/0144230 A1 | 10/2002 | Rittman |
| 2002/0152453 A1 | 10/2002 | Rittman |
| 2002/0166109 A1 | 11/2002 | Rittman |
| 2005/0005256 A1 | 1/2005 | Rittman |
| 2005/0022151 A1 | 1/2005 | Rittman et al. |
| 2005/0142454 A1 | 6/2005 | Fujimoto et al. |
| 2007/0289207 A1 | 12/2007 | May |
| 2008/0086708 A1* | 4/2008 | Rittman ............ G06F 30/398 716/52 |
| 2008/0086709 A1* | 4/2008 | Rittman ............ G06F 30/398 716/55 |
| 2008/0115102 A1 | 5/2008 | Rittman |
| 2008/0134129 A1 | 6/2008 | Vickery |
| 2009/0031264 A1* | 1/2009 | Rittman ............ G06F 30/398 716/106 |
| 2011/0229807 A1 | 9/2011 | Hashimoto et al. |
| 2015/0143318 A1* | 5/2015 | Gibson ............ G06F 30/398 716/115 |
| 2021/0012054 A1 | 1/2021 | Adler |

* cited by examiner

| Violation | Width/Nr. Vias | Min Pass | Recommended | Rating | Temperature |
|---|---|---|---|---|---|
| More Vias Required (Via1) | 1 | 30 | 33 | 3000.0% | 320.00 |
| More Vias Required (Via1) | 1 | 30 | 33 | 3000.0% | 200.00 |
| More Vias Required (Via1) | 1 | 30 | 33 | 3000.0% | 200.00 |
| More Vias Required (Via1) | 1 | 30 | 33 | 3000.0% | 200.00 |
| More Vias Required (Via1) | 1 | 30 | 33 | 3000.0% | 200.00 |
| Narrow Wire (Metal2) | 0.300 | 6.045 | 6.650 | 2015.2% | 320.00 |
| Narrow Wire (Metal2) | 0.400 | 6.050 | 6.655 | 1512.5% | 320.00 |
| More Vias Required (Via1) | 1 | 7 | 7 | 636.4% | 320.00 |
| More Vias Required (Via1) | 6 | 30 | 33 | 500.0% | 200.00 |
| More Vias Required (Via1) | 6 | 30 | 33 | 500.0% | 320.00 |
| Narrow Wire (Metal1) | 0.300 | 1.175 | 1.290 | 390.9% | 320.00 |
| Narrow Wire (Metal1) | 0.400 | 1.170 | 1.285 | 292.0% | 320.00 |
| Narrow Wire (Metal1) | 0.400 | 1.170 | 1.285 | 292.0% | 320.00 |
| Narrow Wire (Metal2) | 0.300 | 0.505 | 0.555 | 168.2% | 320.00 |
| More Vias Required (Via1) | 2 | 3 | 3 | 136.4% | 320.00 |
| Narrow Wire (Metal2) | 0.400 | 0.500 | 0.550 | 125.0% | 320.00 |

Analysis Info

NetName : ibiasCP
Transistors (N/P/UN)# : 21/4/0
MatchedDev (N/P/Pin)# : 6/1/0
AnalysisType : EM_ACTUAL
WorstCurrent(ave) : -6.338227e-07
CurrentSource : ElectDev(8)
Vias# : 151
Black's Formula : OFF
CurrentDistribution : OFF
BlechFilter# : 0
Errors# : 32
IgnoredEndWires# : 36
WeakestWire (w.w.) :
w.w. Layer :
w.w. Width : 0
w.w. CurrentSource : un
w.w. Current : 0
w.w. MaxPassCurrent : 0
w.w. Rating% : 0.0
**************************

FIG. 4A

| Violation | Width/Nr. Vias | Min Pass | Recommended | Rating |
|---|---|---|---|---|
| More Vias Required (Via) | 1 | 2 | 2 | 200% |
| Narrow Line (Metal1) | 1.29 | 1.5 | 1.8 | 132.7% |

Job Status: Done - '2' Errors Found

[ ] Enable Pass Markers
[ ] Zoom to Violation
[ ] Clear net Markers on Recheck
[ ] Clear all Markers on Recheck

FIG. 4B

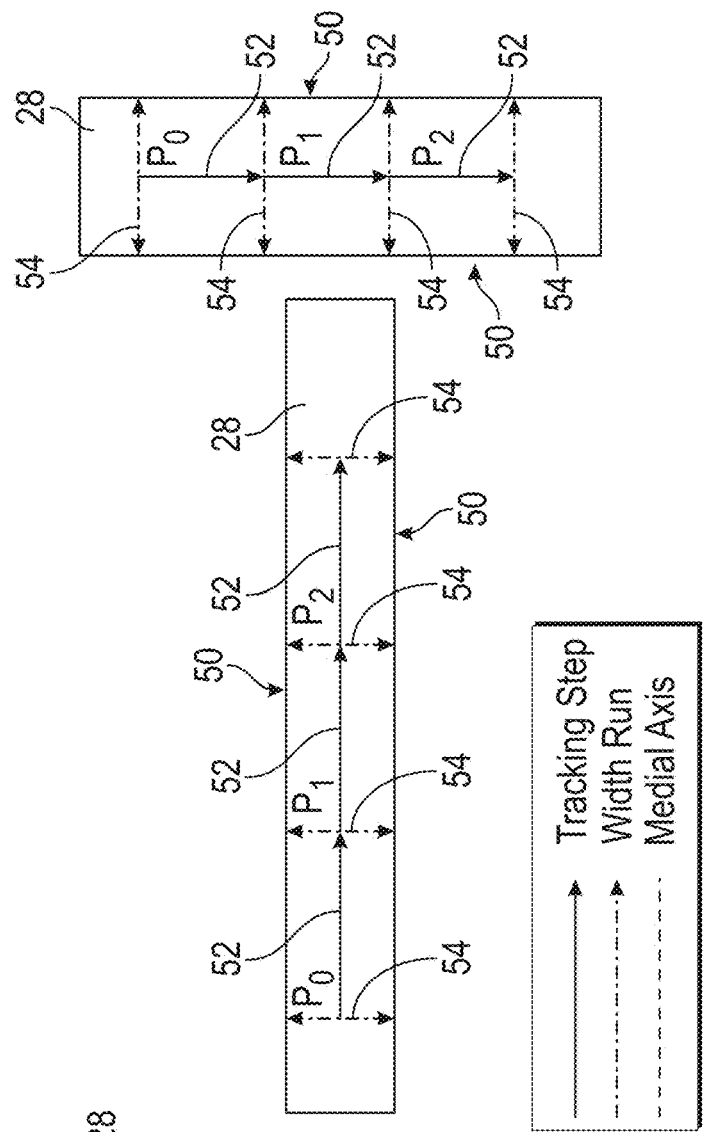
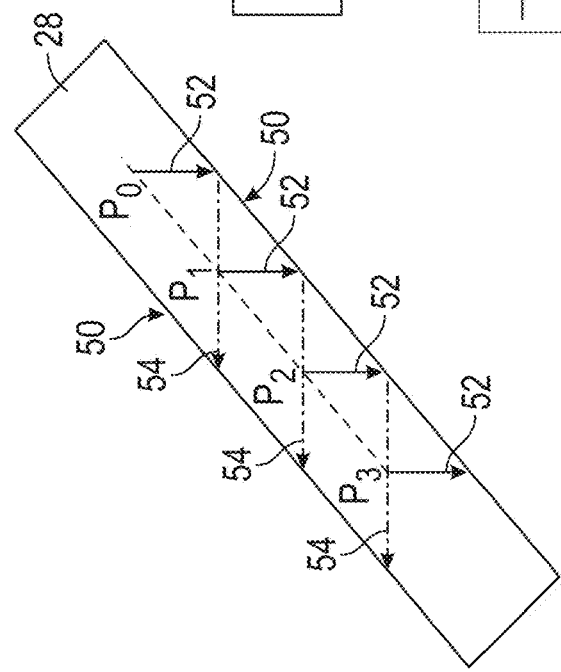
FIG. 8C
FIG. 8B
FIG. 8A

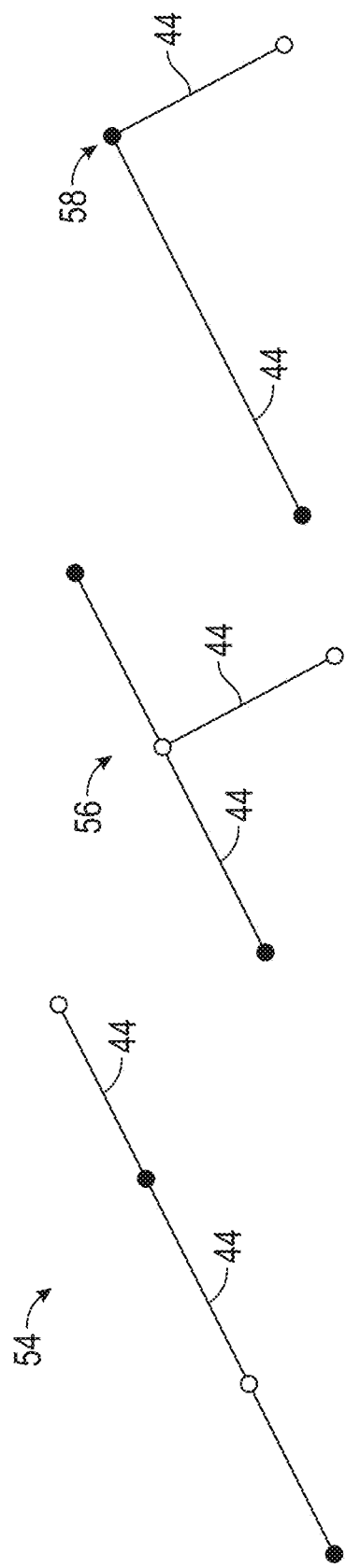

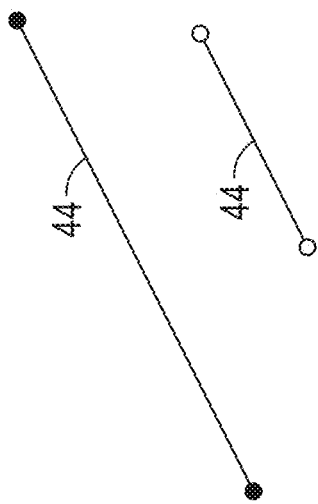
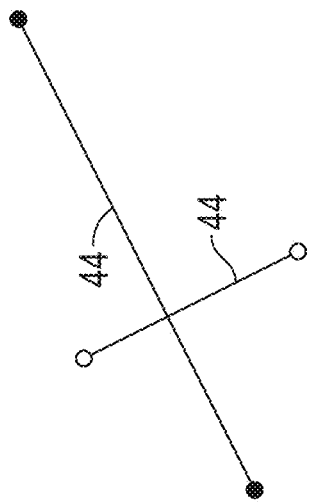
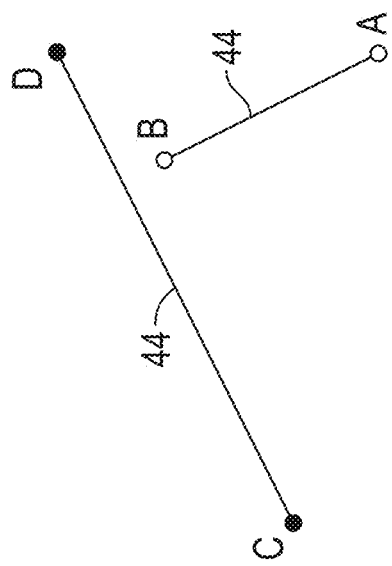
FIG. 10

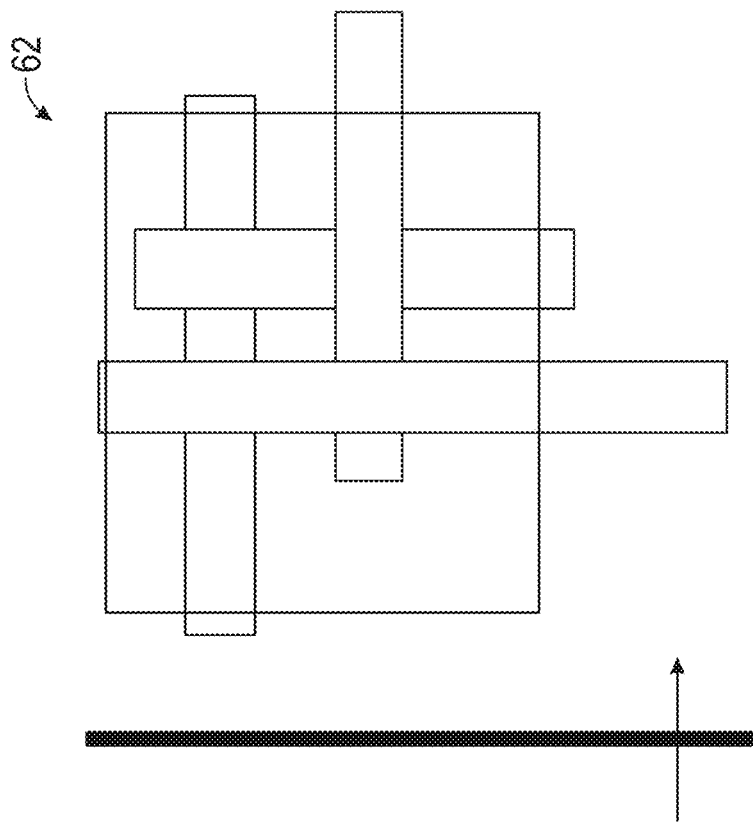
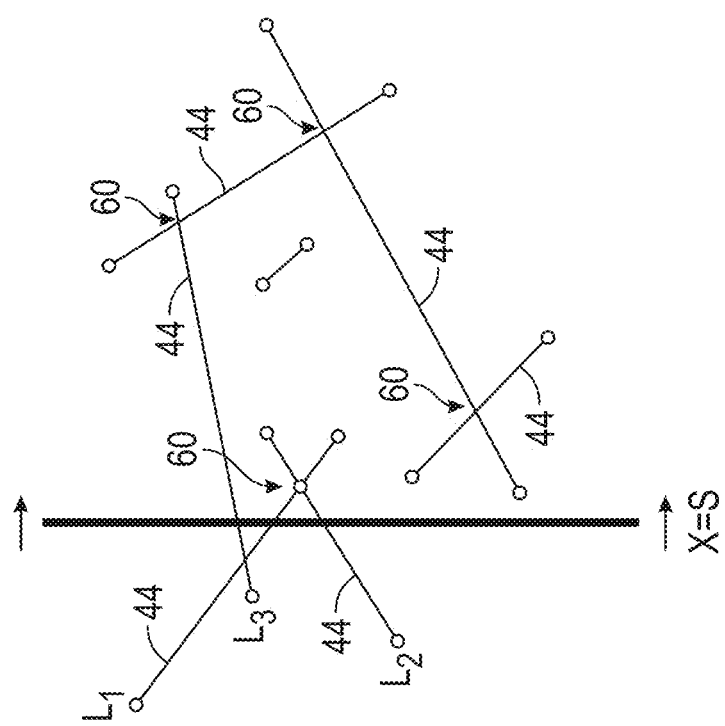
FIG. 11

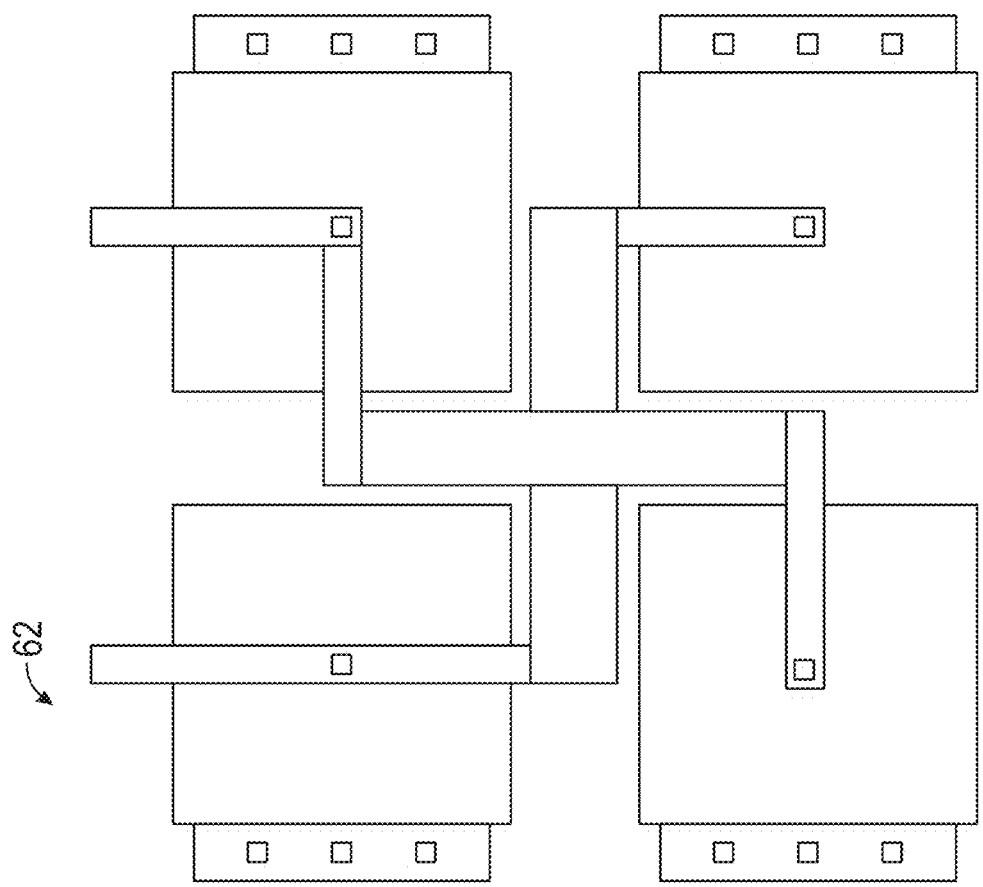
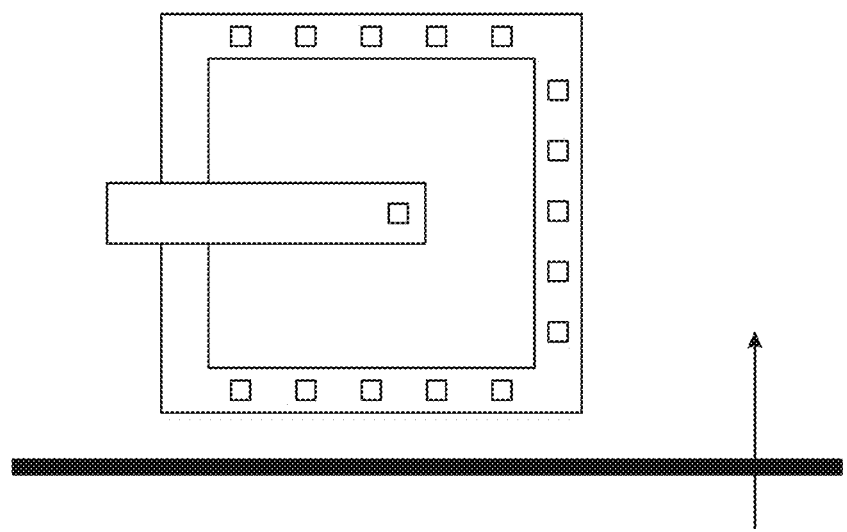
FIG. 12

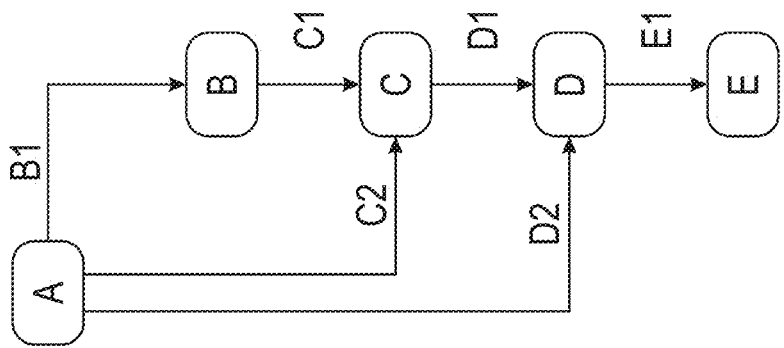
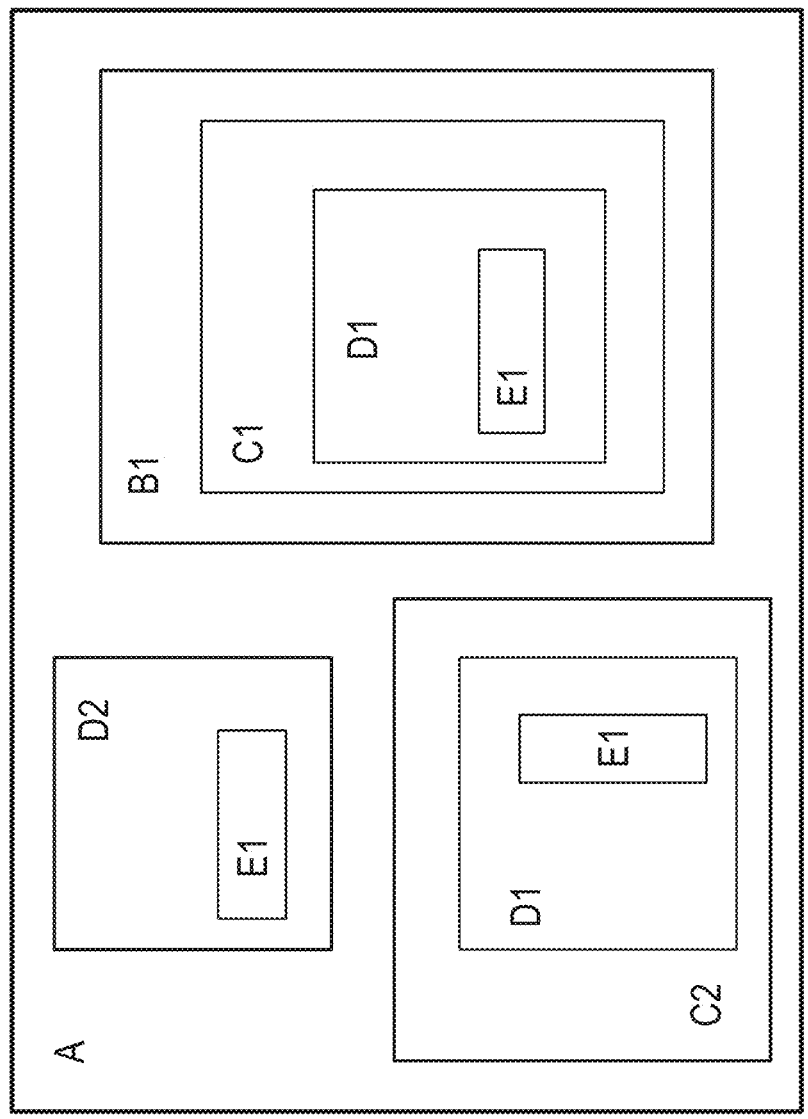
FIG. 15A

SYSTEMS AND METHODS FOR ELIMINATING ELECTROMIGRATION AND SELF-HEAT VIOLATIONS IN A MASK LAYOUT BLOCK

FIELD

The present disclosure relates to systems and methods for eliminating electromigration and self-heat violations during construction of a mask layout block and maintaining the process design rules (DRC Clean) and layout connectivity (LVS Clean) correctness in the metallic, polysilicon, contacts, and VIA's interconnects of an integrated circuit device.

BACKGROUND

Nanometer designs contain millions of devices and operate at very high frequencies. The current densities (current per cross-sectional area) in the signal lines and power are consequently high and can result in either signal or power electromigration problems. The electron movement induced by the current in the metal power lines causes metal ions to migrate. That phenomenon of transport of mass in the path of a DC flow, as in the metal power lines in the design, is termed power electromigration.

There are two types of electromigration. Uni-Directional, for example, power and static signals and Bi-Directional, for example, clocks and other switching signals. The most critical is the Uni-Directional electromigration type since the electron "erosion" moves constantly in one direction and can cause signal line failure. The power electromigration effect is harmful from the point of view of design reliability, since the transport of mass can cause open circuits, or shorts, to neighboring wires.

Electromigration is not a function of current, but of current density. It is also accelerated by elevated temperature. Thus, electromigration is easily observed in Al metal lines that are subjected to high current densities at high temperature over time. The higher current density around the void results in localized heating that further accelerates the growth of the void, which again increases the current density. The cycle continues until the void becomes large enough to cause the metal line to fuse open.

Typically, the most susceptible to electromigration phenomenon are metallic interconnections of an integrated circuit (IC). EM effects become more prominent as IC feature sizes decrease and as IC frequencies and current densities increase. EM in IC devices occurs due to direct current flow. High direct current density in an IC device causes atoms and ions in the conductors of the device to move in the opposite direction of the direct current flow. In particular, when high direct current densities pass through thin conductors, metal ions accumulate in some regions and voids form in other regions of the conductors.

The accumulation of metal ions may result in a short circuit to adjacent conductors, and the voids may result in an open-circuit condition. However, if the current density can be kept below a predetermined EM threshold, EM can be rendered negligible for the life of any particular IC device. Therefore, EM due to direct current flow in IC devices is a major concern with respect to the potential for device failures and the overall reliability of the device.

IC devices may also have alternating current flow. The alternating current density in an IC device that results from alternating current flow causes atoms and ions in the conductors of the device to first move in one direction and then move in the opposite direction, back to their original positions. A plurality of conductors with alternating current flow is defined as a signal net.

In contrast to conductors with direct current flow, conductors with alternating current flow do not directly cause EM problems. However, conductors with alternating current flow do use power and generate heat. Since EM is very sensitive to the temperature of the conductors, it is often necessary to limit the temperature increase of the conductors in IC devices that results from the heating due to alternating current flow. Therefore, the alternating current flow in a conductor does have an impact on EM because the heating due conductors with alternating current may increase the overall temperature of the IC device by heating up neighboring conductors with direct current flow.

As noted above, EM effects also become more prominent as IC feature size decreases. To counteract this effect, background art methods for controlling EM used wider conductor widths for an entire IC wiring network affected by EM. However, since EM problems become less severe as one moves away from a current source pin and toward each of the current sink pins of a wiring network, wider conductor widths are typically not required for the entire IC wiring network. Often, only a small segment of the IC wiring network needs the wider conductor width to eliminate EM problems for the entire IC wiring network. Therefore, these background art methods that use wider conductors throughout the IC wiring network often waste valuable space on the IC device.

Other background art methods provide EM control by setting limits on the power dissipated in conductors with alternating current flow. In these background art methods adjacent conductors with direct current flow are only allowed to be heated by a maximum temperature difference .DELTA.T.sub.MAX in order to maintain the reliability of the IC device. In particular, to limit the heat generated as a result of the temperature difference .DELTA.T caused by alternating current flow in adjacent conductors, a maximum root-mean-square (RMS) current limit (I.sub.RMS) is set for all conductors with alternating current flow adjacent to a conductor with direct current flow.

The maximum current limit is set by: (1) considering the minimum distance between conductors with alternating current flow and conductors with direct current flow; and (2) the maximum temperature difference .DELTA.T.sub.MAX that maintains the reliability of the IC device. However, using this type of worst-case "minimum distance-between-conductors" approach to determine space between conductors also wastes valuable space on the IC device.

In a typical integrated circuit design process, an electromigration and self-heat check (EMSH Check) tool analyzes a mask layout file for electromigration and self-heat violations and identifies any violations in an output file. A layout designer may use the output file to manually eliminate the identified electromigration and self-heat violations. Then the same IC layout block needs to be re-checked for electromigration and self-heat again as well as other checks like DRC (Design Rule Check) and LVS (Layout vs. Schematics) to make sure that the connectivity and geometrical sizes are correct according to the technology file and schematics respectively. These repeated cycles are time consuming and tedious procedures.

Electromigration failures take time to develop and are therefore difficult to detect until they happen. Thus, the best solution to electromigration problems is to prevent them from taking place. Therefore, it is imperative to eliminate electromigration and self-heating issues to maintain a reliable integrated circuit operation for many years.

Accordingly, there is a need for novel systems and methods to prevent electromigration and self-heating problems from arising in mask layout block construction. In addition, there is a need for new systems and methods to eliminate electromigration and self-heating issues early in the IC layout design phase. There is also a need for systems and methods to improve construction of a mask layout block. In addition, there is a need for systems and methods for maintaining process design rules and layout connectivity during construction of a mask layout block. There is also a need for an electromigration self-heat aware (EMSH Aware) tool that prevents electromigration and self-heat violations from being created during the construction of a mask layout block.

SUMMARY

The present disclosure, in its many embodiments, alleviates to a great extent the disadvantages and problems associated with eliminating electromigration and self-heat violations during construction of a mask layout block and maintaining the process design rules (DRC Clean) and layout connectivity (LVS Clean) correctness by providing systems and methods to eliminate electromigration and self-heating issues early in the IC layout design phase. Disclosed systems and methods reduce or eliminate electromigration and self-heat violations during construction of a mask layout block by automatically preventing a polygon from being placed, created or edited in a selected position in a mask layout block if an electromigration and/or self-heat rule violation is identified. In this way a significant amount of time is saved during the final reliability verification of the integrated circuit, achieving on-time tapeouts (microchip completion) and avoiding re-spins.

Disclosed systems and methods advantageously provide a robust reliability-aware integrated circuit layout design environment. Embodiments also include a nanoGeo Engine supporting deep nanometer processes. Complex design style support is provided as well as geometrical rules "understanding" and support (Boolean language development) for e.g., digital, mixed signal, analog, and RF designs. As described in detail herein, disclosed embodiments include advanced systems for violation analysis and auto-correction. The systems and methods are interactive in real time and advantageously provide significant time savings during the design cycle and for time-to-market. This time savings could be up to 40% in some embodiments.

In accordance with an exemplary embodiment, an automated method for eliminating electromigration and self-heat violations during construction of a mask layout block includes analyzing a selected polygon(s) in a mask layout block and obtaining one or more electromigration and self-heat rules associated with the polygon from a technology or external constraints file. The method provides a violation marker associated with the selected position for the polygon that graphically represents a space, width or length in the mask layout block where the selected polygon's position complies with the electromigration and self-heat rules. The method and system also provide an option to automatically correct the electromigration (EM) and self-heat violation of the mask layout block, maintaining the process design rules (DRC Clean) and layout connectivity (LVS Clean) correctness.

In accordance with another exemplary embodiment, an automated method for eliminating electromigration and self-heat violations during construction of a mask layout block includes analyzing a selected polygon in a mask layout block and identifying an electromigration and/or self-heat violation in the mask layout block if the selected position, with or length of the polygon is less than electromigration and self-heat value permitted from a technology or external constraints file. If the electromigration and self-heat violation is identified, the placement, creation, or editing of the polygon at the selected position is automatically prevented, maintaining the process design rules (DRC Clean) and layout connectivity (LVS Clean) correctness.

In accordance with a further exemplary embodiment, a computer system for eliminating electromigration and self-heat violations during construction of a mask layout block, maintaining the process design rules (DRC Clean) and layout connectivity (LVS Clean) correctness includes a processing resource coupled to a computer readable memory. Processing instructions are encoded in the computer readable memory. When the processing instructions are executed by the processing resource, the instructions analyze a selected polygon in a mask layout block and identify an electromigration and/or self-heat violation in the mask layout block if the selected position is less than an electromigration and/or self-heat rule from a technology or external constraints file. If the electromigration and self-heat violation is identified, the instructions prevent the polygon from being placed, created or edited at the selected position in the mask layout block, thereby maintaining the process design rules (DRC Clean) and layout connectivity (LVS Clean) correctness.

Exemplary embodiments of a computer-implemented method for eliminating electromigration and self-heat violations during construction of a mask layout block comprise analyzing a selected polygon and determining a selected position of the selected polygon. Then one or more electromigration rules or self-heat rules associated with the selected polygon are obtained. An information window with the one or more electromigration or self-heat rules and a violation marker associated with the selected position of the selected polygon are provided. Exemplary methods may include determining if the selected position for the selected polygon creates a feature dimension in the mask layout block greater than at least one of the one or more electromigration rules or self-heat rules and may further comprise modifying the selected position such that the feature dimension is approximately equal to the at least one of the electromigration rules and self-heat rules. The violation marker prevents creating, placing, and editing the selected polygon if the selected position would violate at least one of the one or more electromigration rules or self-heat rules.

In exemplary methods, the one or more electromigration or self-heat rules are obtained from a technology file or external constraints file. The violation marker may graphically represent a characteristic of the selected polygon comprising one or more of: width, space, and length. In exemplary embodiments, a method further comprises analyzing the mask layout block for violations of the electromigration rules or self-heat rules. Methods may further comprise determining if the selected position contains an amount of contact polygons or VIA polygons in compliance with the electromigration rules and self-heat rules. Exemplary methods include modifying the amount of contact polygons or VIA polygons to ensure compliance with the electromigration rules and self-heat rules.

In exemplary embodiments, a computer-implemented method of improving construction of a mask layout block comprises analyzing a selected polygon and determining a selected position of the selected polygon. The method may include providing a violation marker associated with the selected position of the selected polygon. Exemplary methods include determining if the selected position of the selected polygon produces a violation of one or more electromigration rules or self-heat rules associated with the selected polygon. The methods may also comprise preventing creating, placing, or editing of the selected polygon at the selected position if the selected position would violate at least one of the one or more electromigration rules or self-heat rules.

In exemplary embodiments, the selected polygon is placed in an original position in the mask layout block if there is a violation of at least one of the one or more electromigration rules or self-heat rules. Exemplary methods may further comprise adjusting a characteristic of the selected polygon such as width, space, and length. The amount of contact polygons or VIA polygons may be adjusted until the violation is eliminated. Disclosed methods may also comprise determining if the selected position produces a violation of at least one of the one or more electromigration rules or self-heat rules in a top-level cell. Exemplary methods further comprise generating a mask layout file from the mask layout block. The generated mask layout file is without a violation of at least one of the one or more electromigration rules or self-heat rules.

Exemplary systems for maintaining process design rules and layout connectivity during construction of a mask layout block are also provided. Such systems may comprise a processor, a computer-readable memory, a polygon analysis module, a violation marker, and an information window. The polygon analysis module is configured to analyze a selected position of a selected polygon in the mask layout block, and the violation marker is associated with the selected polygon. The information window has electromigration rules or self-heat rules. In exemplary embodiments, the system determines if the selected position of the selected polygon or a length or width of the selected polygon violates an electromigration rule or self-heat rule. The system may prevent creation, placement, and editing of the selected polygon at the selected position if the selected position or the length or width would violate an electromigration rule or self-heat rule.

In exemplary embodiments, the mask layout block is hierarchical and includes at least one top-level cell and at least one subcell. In exemplary embodiments, when there is a violation of an electromigration rule or self-heat rule, the system places the selected polygon in an original position in the mask layout block. When there is a violation of an electromigration rule or self-heat rule, the system may adjust the selected position of the selected polygon until the violation of the electromigration or self-heat rule is eliminated. When there is a violation of an electromigration rule or self-heat rule, the system may adjust at least a part of the length or width of the selected polygon until the violation of the electromigration or self-heat rule is eliminated. Disclosed systems may further comprise a technology file or an external constraints file containing the electromigration rules or self-heat rules.

Another important technical advantage of exemplary embodiments includes an EMSH Aware tool that significantly reduces the design time for an integrated circuit. In addition, disclosed embodiments may eliminate electromigration and self-heat violations from a mask layout block before the mask layout block is converted into a mask layout file. The time needed to complete the design process for the integrated circuit, therefore, may be substantially reduced since the steps of checking the layout with an EMSH tool and correcting the identified electromigration and self-heat violations may be eliminated.

Accordingly, it is seen that systems and methods for eliminating electromigration and self-heat violations and maintaining process design rules and layout connectivity during construction of a mask layout block are provided. These and other features of the disclosed embodiments will be appreciated from review of the following detailed description, along with the accompanying figures in which like reference numbers refer to like parts throughout.

BRIEF DESCRIPTION OF THE DRAWINGS

The foregoing and other objects of the disclosure will be apparent upon consideration of the following detailed description, taken in conjunction with the accompanying drawings, in which:

FIGS. 4A, 4B, and 4C are front views of exemplary embodiments of information windows in accordance with the present disclosure;

FIGS. 8A, 8B and 8C are schematics of an exemplary embodiment of a scan-line optimization process in accordance with the present disclosure;

FIG. 9 is a schematic of an exemplary layout topology analysis called homogeneous line segment intersection in accordance with the present disclosure;

FIG. 10 is a schematic of an exemplary layout topology analysis called homogeneous line segment intersection in accordance with the present disclosure;

FIG. 11 is a schematic of an exemplary sweep line process in accordance with the present disclosure;

FIG. 12 is a schematic of an exemplary sweep line process in accordance with the present disclosure;

FIG. 15A is a schematic of an exemplary hierarchical extraction method in accordance with the present disclosure;

DETAILED DESCRIPTION

In the following paragraphs, embodiments will be described in detail by way of example with reference to the accompanying drawings, which are not drawn to scale, and the illustrated components are not necessarily drawn proportionately to one another. Throughout this description, the embodiments and examples shown should be considered as exemplars, rather than as limitations of the present disclosure.

As used herein, the "present disclosure" refers to any one of the embodiments described herein, and any equivalents. Furthermore, reference to various aspects of the disclosure throughout this document does not mean that all claimed embodiments or methods must include the referenced aspects. Reference to materials, configurations, directions, and other parameters should be considered as representative and illustrative of the capabilities of exemplary embodiments, and embodiments can operate with a wide variety of such parameters. It should be noted that the figures do not show every piece of equipment, nor the materials, configurations, and directions of the various circuits and communications systems.

Figure 1:
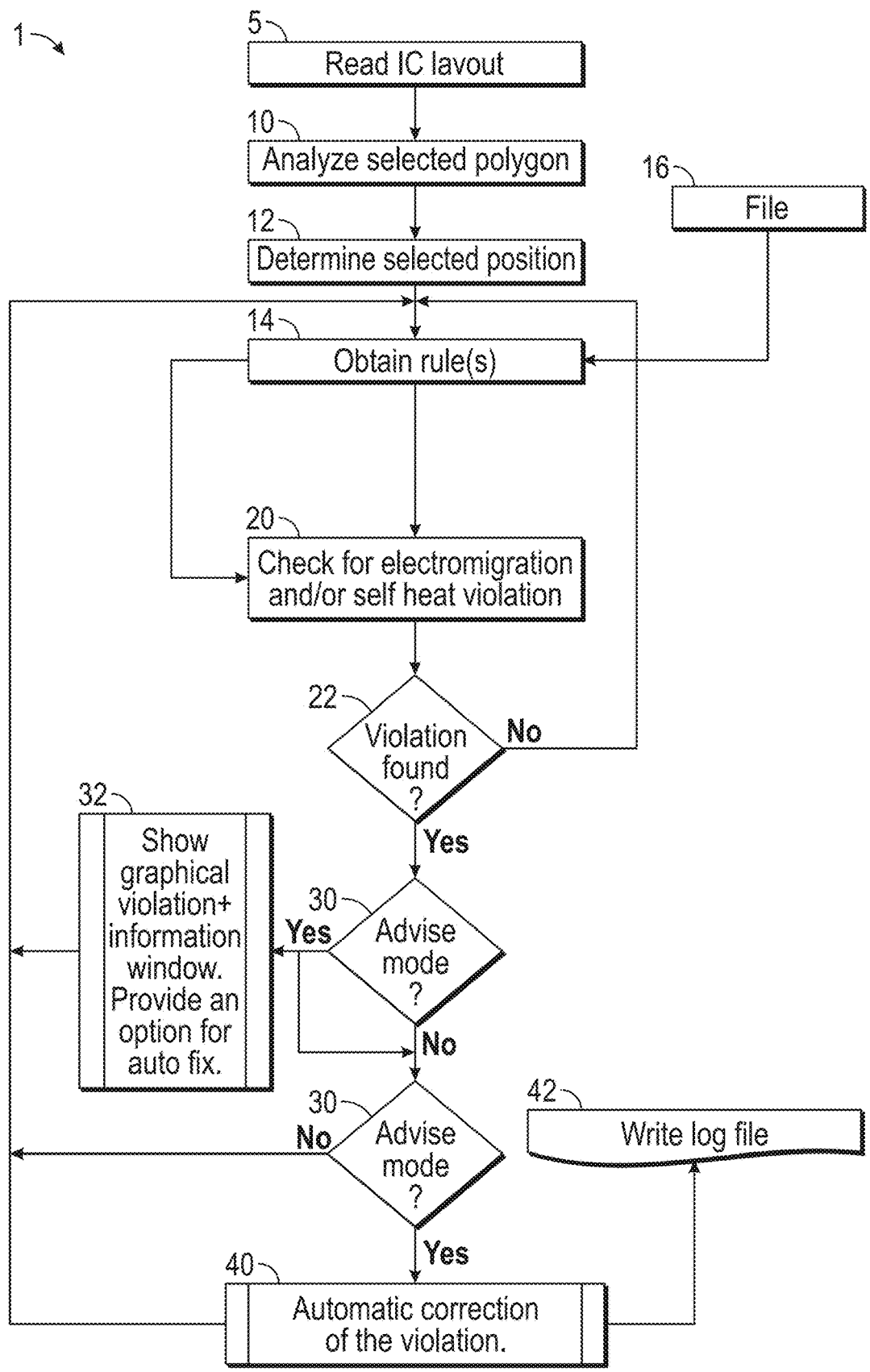
FIG. 1 is a flow chart showing an exemplary embodiment of a system and computer-implemented method for eliminating electromigration and/or self-heat violations and maintaining process design rules and layout connectivity during construction of a mask layout block in accordance with the present disclosure.

Exemplary embodiments of a computer-implemented method 1 for eliminating electromigration and/or self-heat violations during construction of a mask layout block 6, maintaining the process design rules (DRC Clean) and layout connectivity (LVS Clean) correctness is illustrated in FIG. 1. In exemplary embodiments, the mask layout block 6 is hierarchical and includes at least one top-level block or cell and at least one sub-block or sub-cell. Generally, the initial broad steps may be reading 5 the layout of the integrated circuit. Exemplary method steps include analyzing 10 a selected polygon in the mask layout block and may further include determining 12 a selected position 26 of the selected polygon 28. The selected position for the polygon typically would be a location for the polygon in the mask layout block and may include a location for edges of the polygon 28 in the mask layout block.

Figure 2:
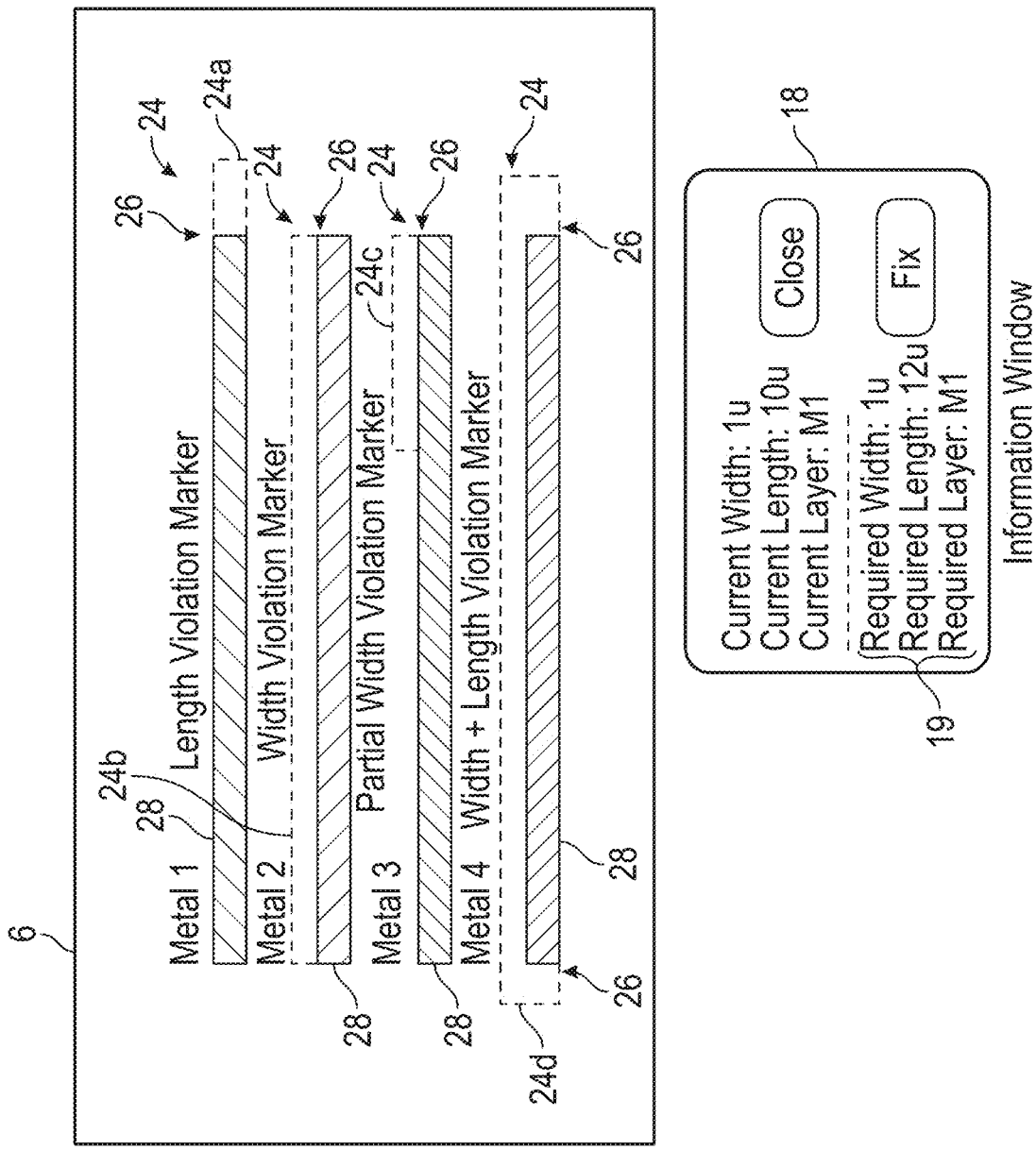
FIG. 2 is a schematic of an exemplary embodiment of a system and computer-implemented method for eliminating electromigration and/or self-heat violations and maintaining process design rules and layout connectivity during construction of a mask layout block in accordance with the present disclosure.
Figure 3:
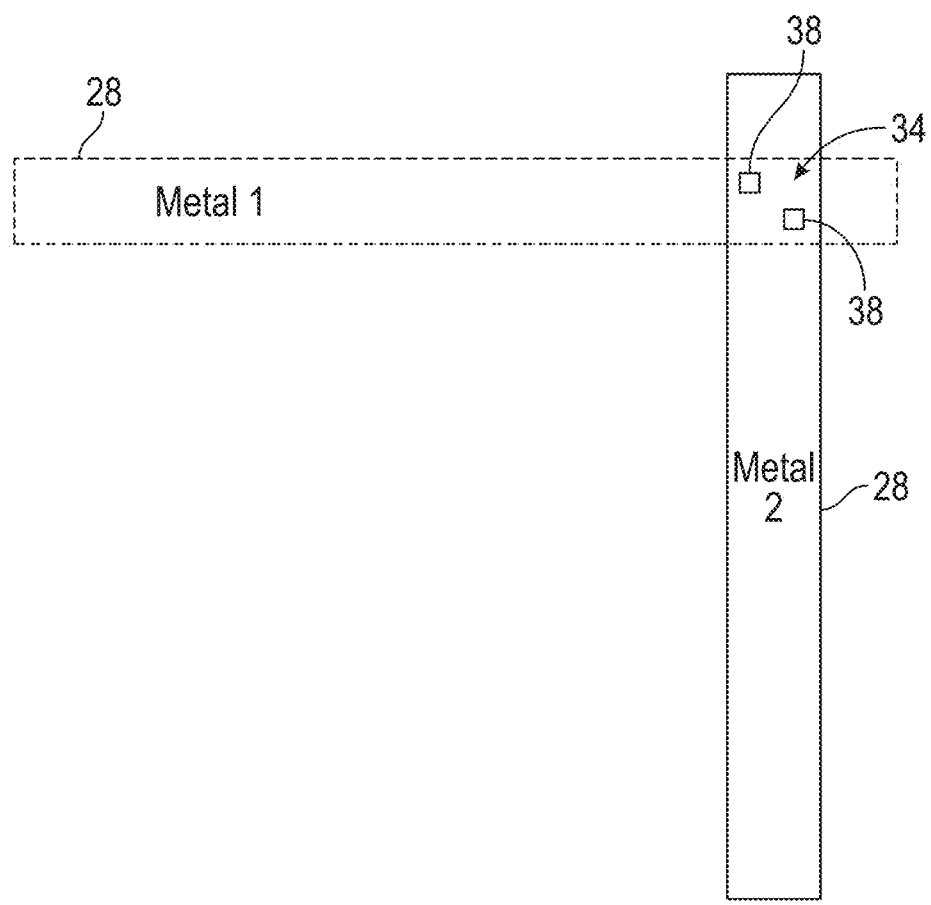
FIG. 3 is a schematic of an exemplary embodiment of a system and computer-implemented method for eliminating electromigration and/or self-heat violations and maintaining process design rules and layout connectivity during construction of a mask layout block in accordance with the present disclosure.

Next, exemplary methods obtain 14 one or more electromigration and/or self-heat rules associated with the polygon. In exemplary embodiments, the rules are obtained from a technology and/or external constraints file 16. As best seen in FIG. 2, an information window 18 may be provided that displays the current and required integrated circuit electromigration and/or self-heat rules or parameters 19. A Design Rule such as an electromigration or self-heat rule pertains to a physical geometrical feature of a polygon. For example: Keep a specific distance, or a specific wire width, etc.

Any electromigration and/or self-heat rules could be provided and applied in disclosed systems and methods during mask layout construction. In exemplary embodiments, the electromigration and/or self-heat rules include, but are not limited to, metals spacing, polysilicon spacing, contact spacing and all types of VIA spacing, metals length, metals width, polysilicon length, polysilicon width, contact length, contact width, and all types of VIA length and width. The rules maintain the process design rules (DRC Clean) and layout connectivity (LVS Clean) correctness.

Next, the mask layout block 6 is analyzed during its construction and checked 20 for the existence of electromigration and/or self-heat violations. In exemplary embodiments, these are determined by a technology and/or external constraints ASCII file 16 which contains net capacitance, resistance parameters and other integrated circuit related reliability factors. Exemplary methods automatically prevent a layout designer from creating, placing, or editing the selected polygon 28 at the selected position 26 based on the violation marker 24 if the selected position creates an electromigration or self-heat rule violation.

As illustrated in FIG. 2, if a violation is found 22, the method provides a violation marker 24 associated with the selected position 26 for the selected polygon 28. The violation marker is operable to graphically represent a width, space, length or any other of the selected polygon's characteristics (e.g., Polygon's Metal type) in the mask layout block 6 where the selected polygon complies with the electromigration and/or self-heat rules. Examples of violation markers include, but are not limited to, a length violation marker 24a, a width violation marker 24b, a partial width violation marker 24c, and width and length violation marker 24d. In FIG. 2, the violation markers are shown as dashed lines.

Exemplary methods determine if the selected position for the selected polygon creates a feature dimension (e.g., space, width or length) in the mask layout block 6 greater than at least one of the electromigration and/or self-heat rules. The boundaries of the violation marker 24 must be met to eliminate the electromigration and/or self-heat violation. Upon user selection of a polygon/metal wire number 1, 2, 3 or 4, an information window 18 is opened. The user has the option to FIX the selected polygon 24 by clicking on the FIX button or close it by clicking on the Close button. The selected position 26 of the selected polygon 28 may be modified until the feature dimension is approximately equal to the at least one electromigration and/or self-heat rule 19, thereby maintaining the process design rules (DRC Clean) and layout connectivity (LVS Clean) correctness.

With reference to FIGS. 3-6, exemplary methods determine if a selected area 34, through a selection box 36, contains a sufficient number of CONTACT or VIA polygons 38 to comply with the electromigration and/or self-heat rules 19. In the example in FIG. 3 two metals/polygons 28 [Metal 1 and Metal 2] are connected through two VIA's 38. The number of CONTACT or VIA polygons 38 may be modified according to an electromigration and/or self-heat rule 19 until it matches the minimum required according to a technology and/or external constraints file rule, thereby maintaining the process design rules (DRC Clean) and layout connectivity (LVS Clean) correctness.

Figure 4:
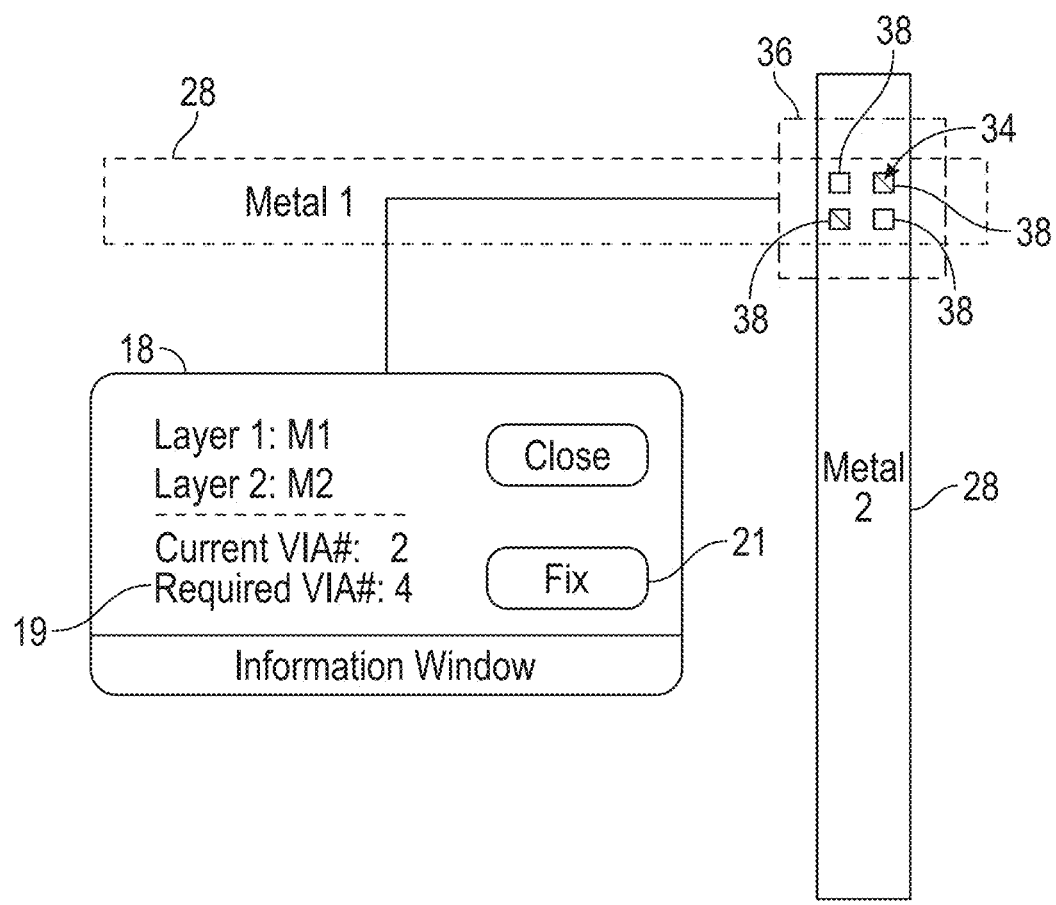
FIG. 4 is a schematic of an exemplary embodiment of a system and computer-implemented method for eliminating electromigration and/or self-heat violations and maintaining process design rules and layout connectivity during construction of a mask layout block in accordance with the present disclosure.

In FIG. 4, two metals/polygons 28 [Metal 1 and Metal 2] are connected through two VIA's 34. The information window 18 shows the system's recommendation to place four VIA's 34 to connect the two polygons/metals 28. The user has the option to automatically correct the violation by clicking on the FIX button 21, located within the Information Window 18. Upon clicking on the FIX button 21 in the Information Window 18, the system will create a new layout within the connection area (Surrounded by GREEN rectangle) and place four VIA's 34. The system maintains all design rules dimensions according to the technology file 16.

Figure 4C:
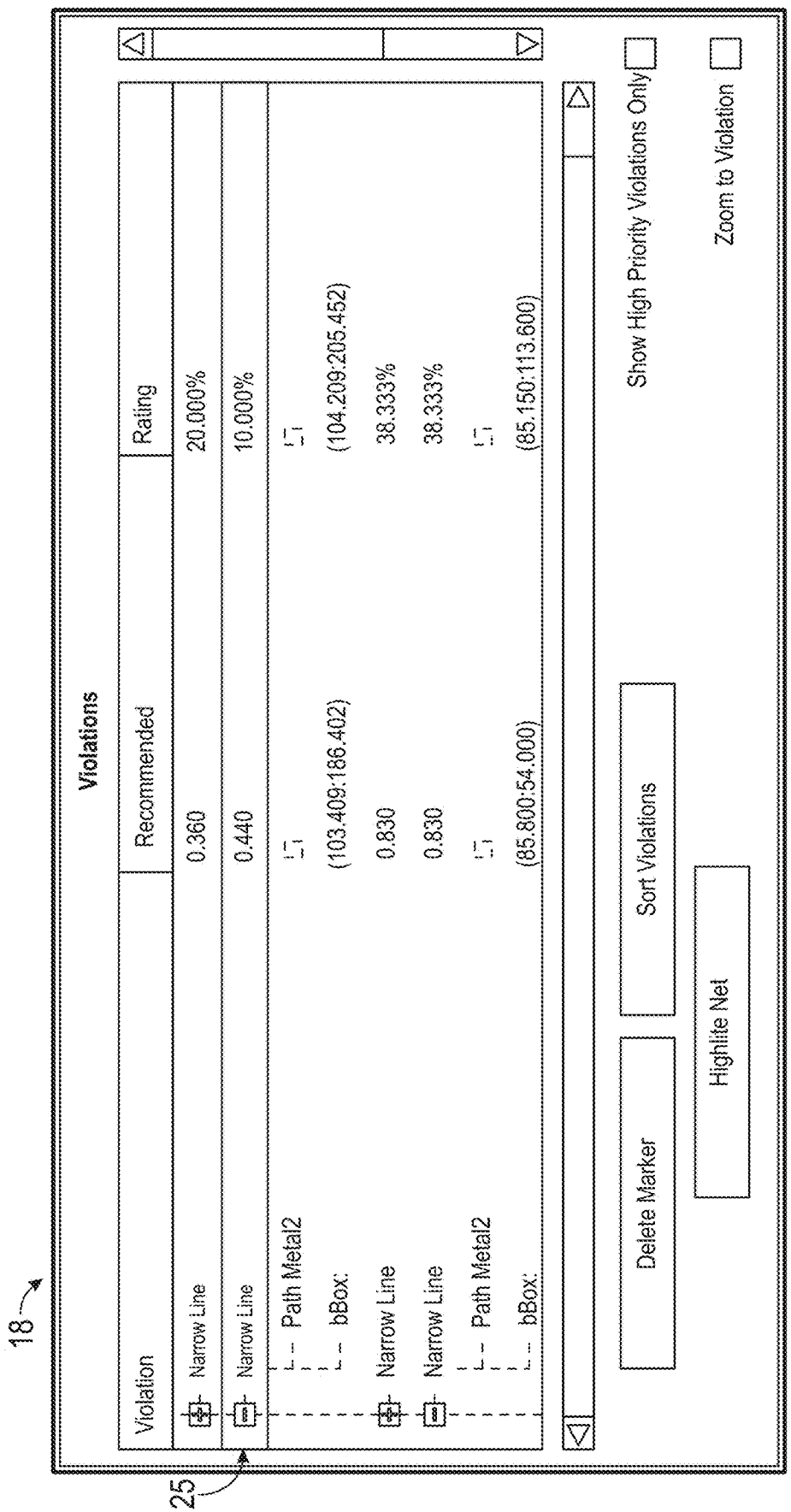

As shown in FIG. 4, the relevant electromigration and/or self-heat rule 19 is displayed as a requirement for rectifying the rule violation. FIGS. 4A-4C illustrate examples of information windows 18 that provide the user with detailed information about violations found and requirements for fixing the violations. FIG. 4A shows an exemplary violations browser information window 18 with a list of rules/requirements 19. An adjacent window may be provided to display further analysis information. An exemplary violations information window 18 illustrated in FIG. 4B displays a rule/requirement 19 and a required fix 25. In exemplary embodiments, buttons 27 provide the ability to delete a violation marker or delete all violation markers as well as auto correct functionality. FIG. 4C shows an additional information window 18 with more details regarding recommended fixes 25 to rule violations.

Figure 5:
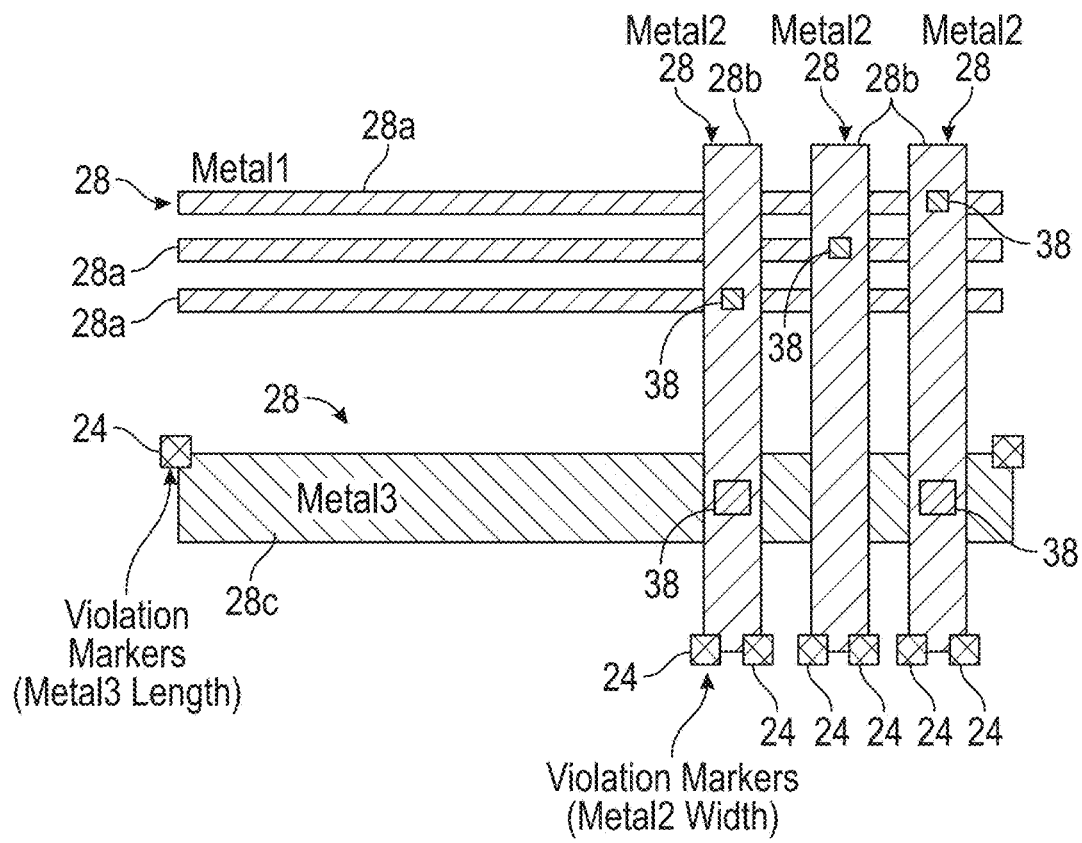
FIG. 5 is a schematic of an exemplary embodiment of a system and computer-implemented method for eliminating electromigration and/or self-heat violations and maintaining process design rules and layout connectivity during construction of a mask layout block in accordance with the present disclosure.
Figure 6:
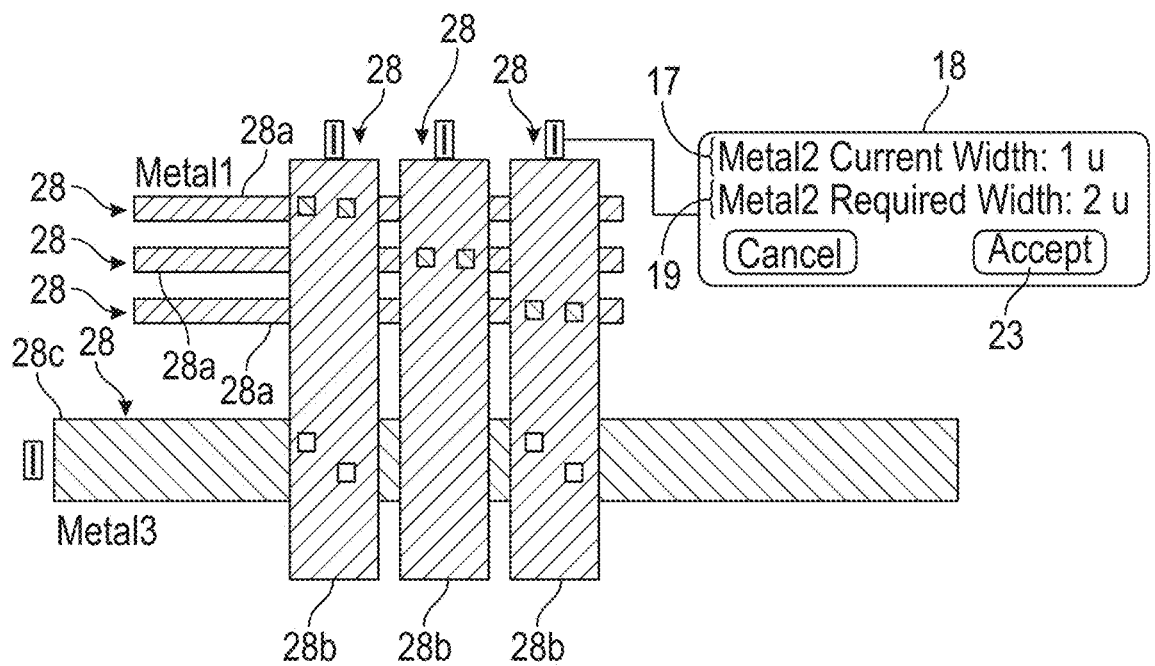
FIG. 6 is a schematic of an exemplary embodiment of a system and computer-implemented method for eliminating electromigration and/or self-heat violations and maintaining process design rules and layout connectivity during construction of a mask layout block in accordance with the present disclosure.

The example in FIG. 5 shows three types of metals/polygons 28, specifically three polygons 28a of metal/polygon number 1, three polygons 28b of metal/polygon number 2, and one polygon 28c of metal/polygon number 3. The metals/polygons 28 are connected by VIAs 38. The system has determined that several violations of electromigration or self-heat rules exist and has placed violation markers 24 at the locations of the violations on the selected polygons 28. As illustrated in FIG. 6, an information window 18 opens that contains the relevant integrated circuit electromigration and/or self-heat rule 19 and the violation 17 found. The user has the option to automatically correct the situation by clicking on the Accept button 23, located within the Information Window 18. Upon clicking on the Accept button 23 in the Information Window 18, the system will correct the width of the violating polygon.

Also provided is an automated method for eliminating electromigration and/or self-heat violations during construction of a mask layout block 6 and maintaining the process design rules (DRC Clean) and layout connectivity (LVS Clean) correctness. For instance, the method may provide the option of entering Advise Mode 30, which, if selected, offers advice 32 through the graphical information window 18 showing violations and providing an option for Auto Fix. An exemplary method includes analyzing a selected polygon 28 in the mask layout block 6 and providing a violation marker 24 associated with the selected polygon 28. The method determines 20 if the selected position, width or length of the selected polygon 28 produces an electromigration and/or self-heat violation in the mask layout block. This determination is based on an electromigration or self-heat rule taken from a technology and/or external constraints file 16.

Exemplary methods automatically prevent a layout designer from creating, placing or editing the polygon in the mask layout block 6 at the selected position based on the violation marker if an electromigration or self-heat violation exists. The method also may automatically correct 40 the violation and place the polygon 28 in an original position in the mask layout block 6 if the electromigration and/or self-heat violation exists, thereby maintaining the process design rules (DRC Clean) and layout connectivity (LVS Clean) correctness. Ultimately, a mask layout or write log file 42 from the mask layout block 6 is generated that does not include the electromigration and/or self-heat violation.

Figure 7A:
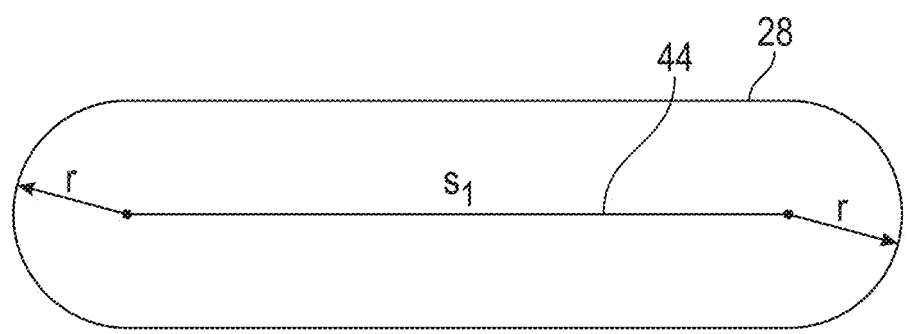
FIGS. 7A, 7B and 7C are schematics of an exemplary embodiment of a scan-line derived process in accordance with the present disclosure.
Figure 7B:
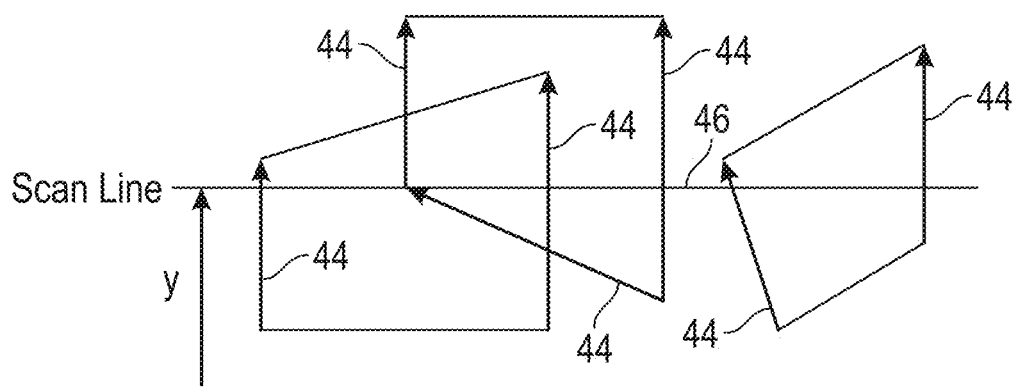
Figure 7C:
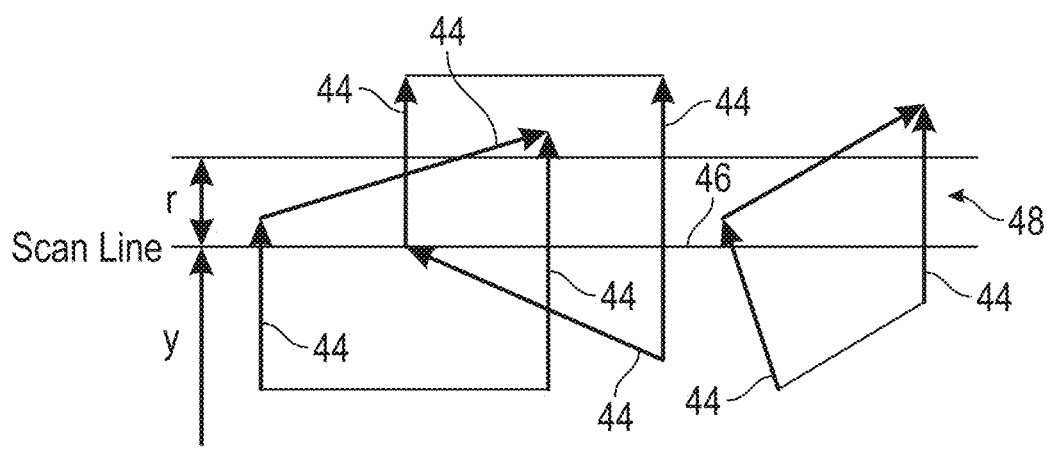

Turning to FIGS. 7A, 7B and 7C, an exemplary method performs polygon analysis using a scan-line derived process. The process includes checking the distance between segments 44. This is performed on segments 44 that represent the internal edges of the selected polygon 28. Exemplary functionality includes defining the set of segments 44 intercepting a virtual scan line 46. Also utilized in this analysis is scan stripe methodology, which is a set of segments 44 intercepting a scan stripe 48. These functionalities advantageously provide the core of Reliability-Per-Object analysis.

FIGS. 8A, 8B and 8C illustrate a related scan-line optimization process. This process comprises scanning the entire selected polygon 28 within its boundaries 50. In exemplary embodiments, the scan-line optimization process takes a tracking step 52 in the tracking direction and takes width runs 54 across the width of the selected polygon 28. The process represents a merging of tracking independent operations. FIG. 8A shows this process with a slant polygon 28 or segment; FIG. 8B shows it with a horizontal polygon 28 or segment; and FIG. 8C shows the process with a vertical polygon 28 or segment.

With reference to FIGS. 9 and 10, an exemplary layout topology analysis called homogeneous line segment intersection will now be described. When presented with a set of any number of line segments, this process advantageously detects intersecting segments extremely quickly. The process is able to make general position assumptions, thereby avoiding degenerate cases. FIG. 9 illustrates degenerate cases of intersecting segments including overlapping colinear segments 44 (object 54), endpoints inside segments 44 (object 56), and shared endpoints (object 58). In FIG. 10, the accurate detection of the same intersecting and non-intersecting segments 44 can be seen. The process queries whether any two-line segments 44 intersect and determines that two segments intersect only if endpoints a and b are on opposite sides of line cd and endpoints c and d are on opposite sides of line ab.

Exemplary processes advantageously provide for early detection of intersections between a set of multiple, i.e., more than two, segments. For instance, a sweep line or plane sweep process is used as a base for early detection of a polygon's reliability rule violations. FIGS. 11 and 12 illustrate an exemplary sweep line process that calculates the intersections 60 of lines, rather than line segments 44. At a line segment starting point the process's first step is performing a binary search to insert the segment in the status data structure 62. Then the segment's neighbors are notified that they are no longer adjacent and their intersection point (if any) is deleted from the stopping points data structure. Then the intersections of this segment with its neighbors (if any) are computed and inserted into the stopping points data structure.

Figure 13:
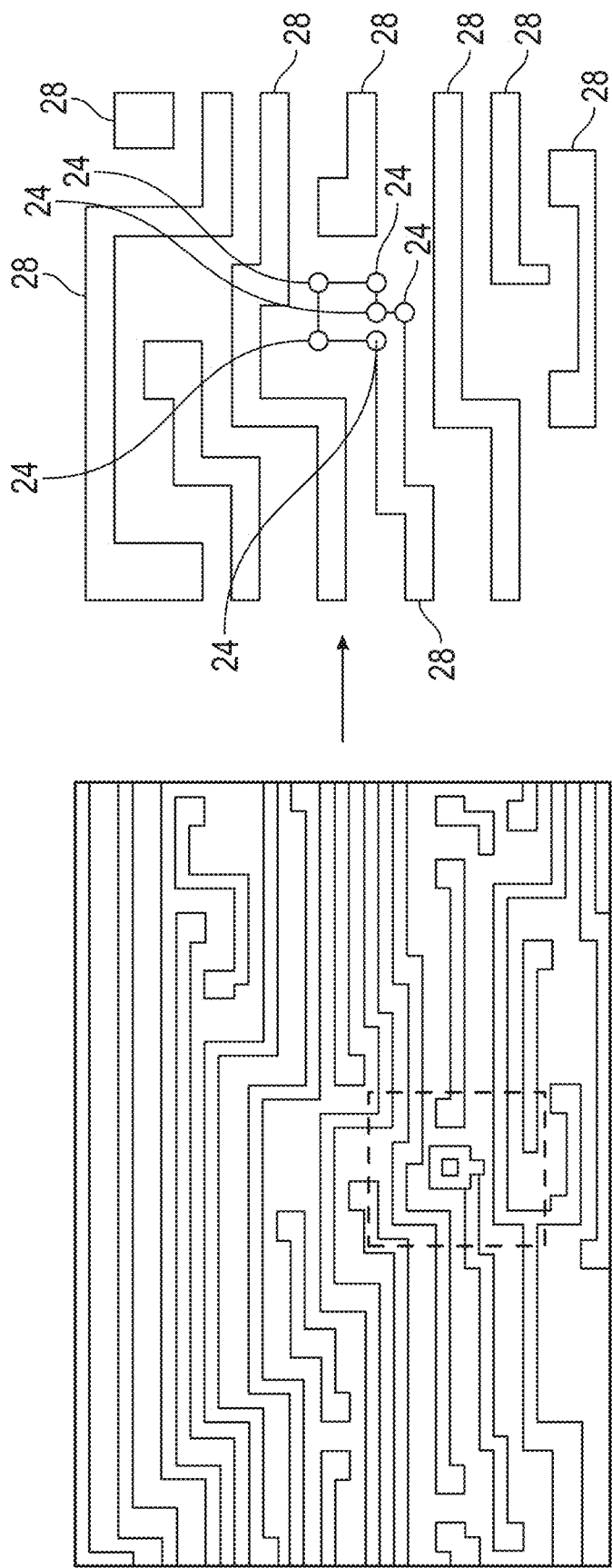
FIG. 13 is a schematic of an exemplary local vicinity pattern extraction process in accordance with the present disclosure.
Figures 14A, 14B:
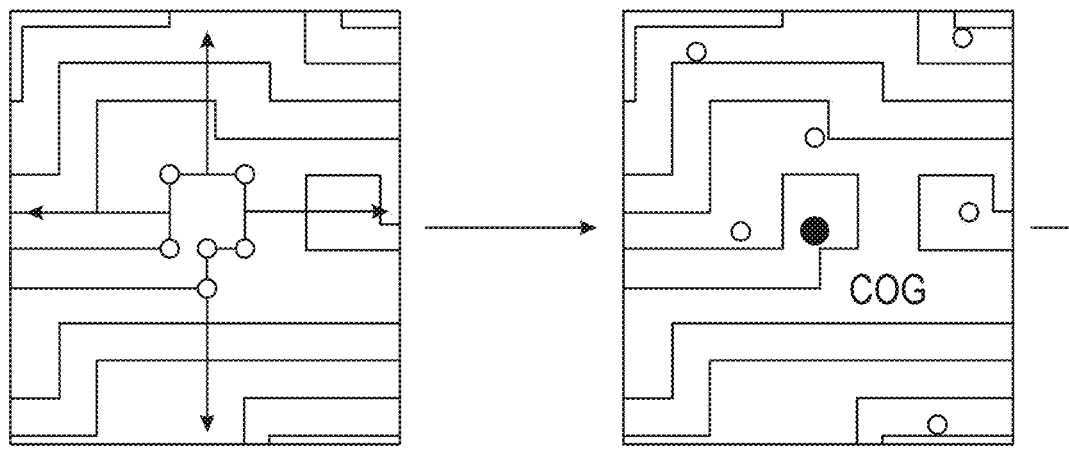
FIGS. 14A-14F are schematics of an exemplary local vicinity pattern extraction process in accordance with the present disclosure.
Figures 14C, 14D:
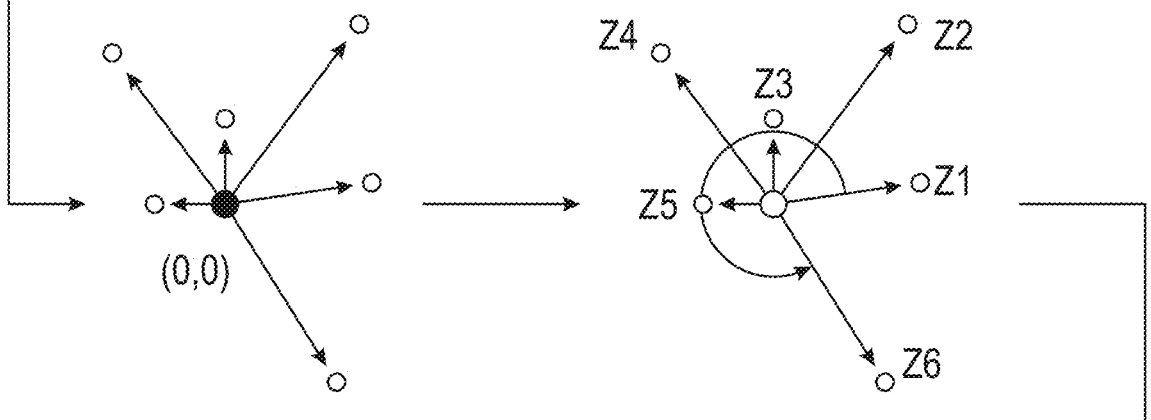
Figures 14E, 14F:
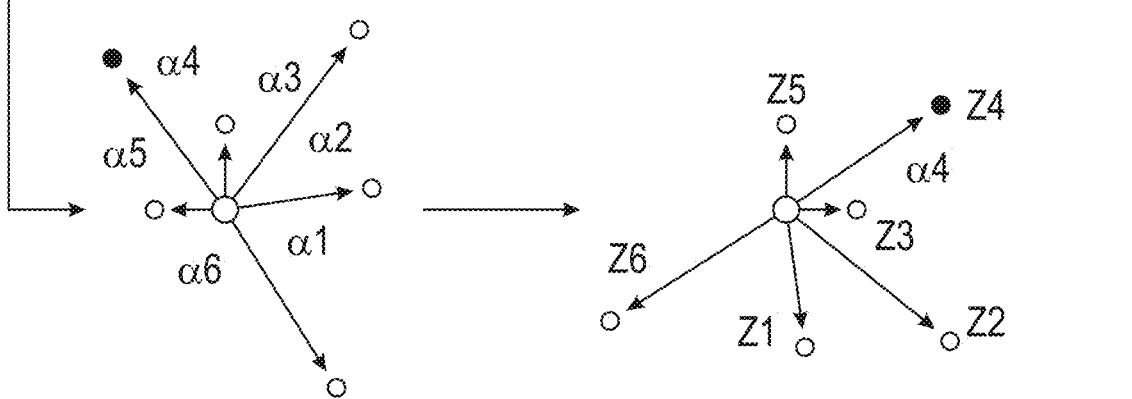

Turning to FIGS. 13 and 14, an exemplary local vicinity pattern extraction process is illustrated for local IC layout extraction. This process advantageously provides fast access to a given NET(S), i.e., electrical nodes, for analyzing polygons 28 or segments, providing violation markers 24, and correcting polygons or segments. The process utilizes a vertices-based analysis which enables area modeling and employs an advanced pattern recognition approach. As illustrated in FIGS. 14A-14F, a pattern signature creation function works by spanning vicinity configuration around a six-vertex subchain (FIG. 14A). The vertices are replaced by the respective instances (FIG. 14B). Position vectors are set according to the absolute angle lengths (FIG. 14C), and relative angles between subsequent vectors are calculated (FIG. 14D). Finally, the entire vicinity is rotated such that $z4$ fall into the first quadrant of the local coordinate system (FIGS. 14E and 14F).

Figure 15B:
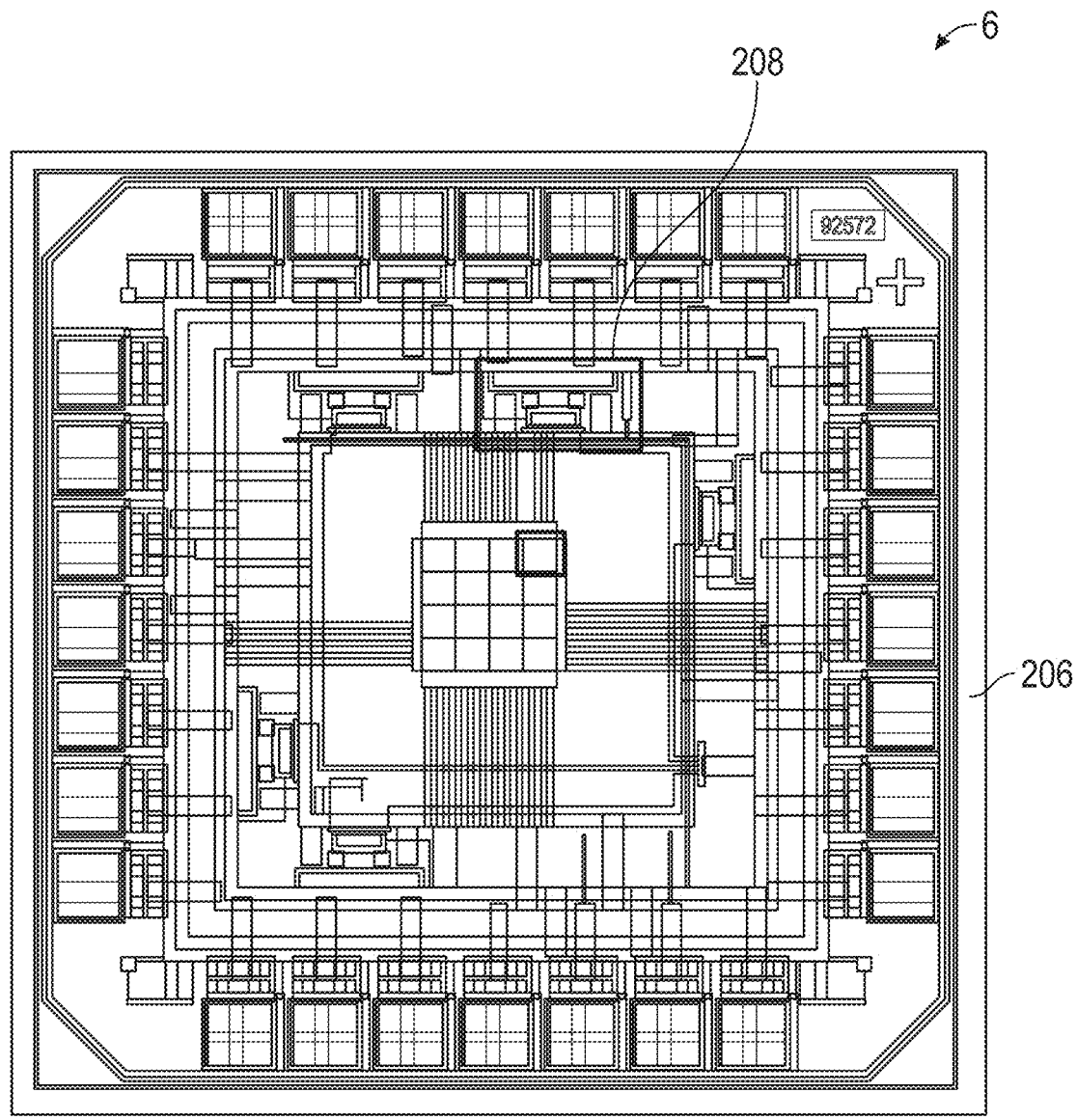
FIG. 15B is a schematic of an exemplary embodiment of a mask layout block having a hierarchical design in accordance with the present disclosure

An exemplary correlated hierarchical extraction method and hierarchical mask layout block will now be described with reference to FIGS. 15A and 15B. This method provides a connection between vicinity patterns and the design hierarchy. Advantageously, the method provides regularity of a design based on its hierarchical representation through an innovative, general purpose hierarchical processing framework. It is a true hierarchical analysis with a flat/hierarchical report. In exemplary embodiments, the mask layout block 6 has a hierarchical design, meaning it has a top-level IC layout block 206 that includes sub-blocks 208. More particularly, the mask layout block 6 includes at least one top-level block or cell 206 and at least one sub-block or sub-cell 208, as illustrated in FIG. 15B. The electrical connectivity (wires) connects between blocks, starting at the top level and/or between the sub-blocks.

Disclosed systems and methods analyze NET at all levels starting at the top-level IC layout block 206 and throughout all sub-cells 208. Exemplary tools check all the way up or down the hierarchy for a given wire. For example, if a wire connects a NET, starting at the top-level block, into a sub-block (also called a sub-cell), the system goes inside the sub-cell all the way through the hierarchy. Sometimes a wire can connect from the top level, into a sub-cell that includes another sub-cell, and so forth. An advanced chip can include a hierarchy of 30 sub-levels down. Disclosed embodiments go all the way inside to the last cell, following the wire.

In the event of a violation of an electromigration and/or self-heat rule violation, exemplary embodiments can take various steps with respect to the selected polygon to eliminate the violation and maintain the process design rules (DRC Clean) and layout connectivity (LVS Clean) correctness. Advantageously, these steps may be performed automatically. For instance, the method may automatically adjust the selected position of the selected polygon until the electromigration and/or self-heat violation is eliminated. The method may automatically adjust the width of the selected polygon until the electromigration and/or self-heat violation is eliminated. In addition, the method may automatically adjust the length of the selected polygon until the electromigration and/or self-heat violation is eliminated. The method may automatically adjust the number of the selected contacts or VIAs until the electromigration and/or self-heat violation is eliminated.

In exemplary embodiments, the mask layout block includes at least one top-level cell and one or more instances of a sub-cell located in the top-level cell. In such instances, the methods may determine if the selected position produces an electromigration and/or self-heat violation in one or more instances of a sub-cell in the mask layout block. The methods may simultaneously prevent the layout designer from creating or placing the polygon in mask layout block at the selected position based on the violation marker in each instance of the sub-cell if the electromigration and/or self-heat violation exists, thereby maintaining the process design rules (DRC Clean) and layout connectivity (LVS Clean) correctness.

Figure 16:
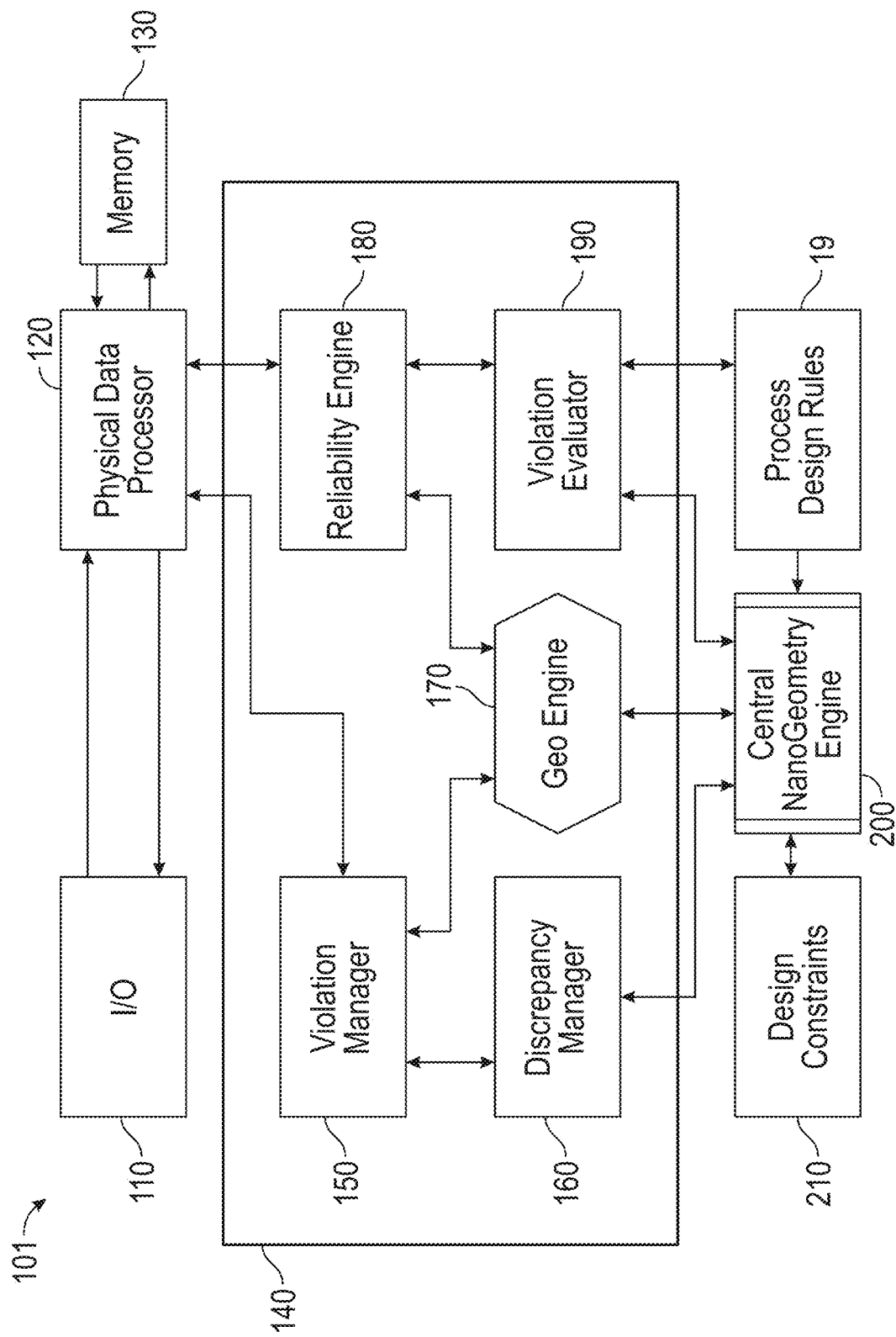
FIG. 16 is a block diagram of an exemplary embodiment of a system for eliminating electromigration and/or self-heat violations and maintaining process design rules and layout connectivity during construction of a mask layout block in accordance with the present disclosure.

Turning to FIG. 16, exemplary embodiments include computer systems and software embodied in computer-readable media. When executed, the software (and the computer system running the software) provides functionality for eliminating electromigration and/or self-heat violations and maintaining the process design rules (DRC Clean) and layout connectivity (LVS Clean) correctness during construction of a mask layout block. A block diagram of a high-level representation of an exemplary system is shown in FIG. 16. An exemplary system 101 comprises an input/output 110, a processor or processing resource 120 and a computer readable memory 130.

A polygon analysis module 140 is provided, and the software provides associated instructions, for the purpose of analyzing a selected position of a selected polygon in the mask layout block. In exemplary embodiments, the polygon analysis module 140 contains tools to carry out the functions described herein, including but not limited to, a violation manager 150, a discrepancy manager 160, a geo engine 170, a reliability engine 180, and a violation evaluator 190. A central NanoGeometry Engine 200 is provided to support deep nanometer processes while adhering to the process design rules 19 and design constraints 210. Also provided by the computer system and the software functionality are a violation marker associated with the selected polygon and an information window with the current and required integrated circuit electromigration and/or self-heat parameters.

Processing instructions may be encoded in the computer readable memory 130. The processing instructions for correcting electromigration and/or self-heat violations in a mask layout file may be encoded in computer-usable media. Such computer-usable media may include, without limitation, storage media such as floppy disks, hard disks, CD-ROMS, DVDs, read-only memory, and random access memory, as well as communications media such wires, optical fibers, microwaves, radio waves, and other electromagnetic or optical carriers.

In exemplary embodiments, the processing instructions, when executed by the processing resource, are operable to perform the following operations. Exemplary operations include determining if the selected position, width or length of the selected polygon produces an electromigration and/or self-heat violation in the mask layout block. This determination may be based on an electromigration and/or self-heat rule taken from a technology and/or external constraints file. The software and computer system may automatically prevent a layout designer from creating, placing or editing the polygon in the mask layout block at the selected position based on the violation marker if the electromigration and/or self-heat violation exists, thereby maintaining the process design rules (DRC Clean) and layout connectivity (LVS Clean) correctness.

The software and processing instructions to enable the computer to perform various operations relating to mask layout block construction and maintaining the process design rules (DRC Clean) and layout connectivity (LVS Clean) correctness. In exemplary embodiments, the computer running the disclosed software automatically places the polygon in an original position in the mask layout block if the electromigration and/or self-heat violation exists. The operations also may include automatically adjusting the selected position of the selected polygon until the electromigration and/or self-heat violation is eliminated. The width and/or length of the selected polygon or a part of the width or length may be adjusted until the electromigration and/or self-heat violation is eliminated.

In exemplary embodiments, the software and processing instructions are operable to perform operations such as determining if the selected position for the polygon creates an electromigration and/or self-heat violation in the mask layout block. This determination is made according to an electromigration and/or self-heat rule taken from a technology and/or external constraints file. The computer may then modify the selected polygon position, width or length until the electromigration and/or self-heat is approximately equal to the associated technology file rule and/or complies with an external constraints file rule according to priority.

The software and processing instructions may operate to automatically adjust selected VIA's position and/or number until the electromigration and/or self-heat violation is eliminated. Further, the software and computer running the software may automatically adjust selected CONTACTS position and/or number until the electromigration and/or self-heat violation is eliminated. In exemplary embodiments, the software has the feature to work in CORRECT mode, during which all edited, placed or created polygons are automatically made electromigration and/or self-heat correct, thereby maintaining the process design rules (DRC Clean) and layout connectivity (LVS Clean) correctness.

It should be noted that exemplary embodiments use neural network technology to learn the IC mask layout features such as metal wires congestion, distances between wires, enclosures, widths, length and similar. The detection and identification algorithm finds points-of-interest of IC layout polygons and characterizes each polygon for electrical constraints. The characterization identifies weak spots for potential electromigration, self-heat and IR drop violations. In exemplary embodiments, the AI engine analyzes the two-dimensional mask layout including corners, junctions, and vertices of polygons, and builds a table-based database to be used as an input for the electrical analysis module.

The AI module has cognitive capabilities and is self-adapting to an IC mask layout data. It can learn and process any type of IC layout style, for example, Analog, Digital, Mixed, RF and MEMS. Exemplary embodiments use a CNN system (Convolutional Neural Network), which includes internal layers communication maintaining the electrical connectivity. The algorithm can handle huge quantities of data due to a heuristic-based, successive approximation approach. The system's adaptation and cognitive capabilities make it operate much like the human brain. Every set of polygons is analyzed from a specific aspect according to its predicted, worse case electrical current that it may carry.

The algorithm's predictive methods complete missing parts of the IC layout, as it may not be fully completed. As the designer is constructing the IC layout, sets of computational geometry-based algorithms are constantly analyzing the data behind the scene, as the CNN is in charge of providing the real time graphical information. These algorithms classify a polygon's features according to identified geometrical details and perform an on-the-fly reliability verification analysis using probabilistic approximation as a starting point. Quickly enough (Nanoseconds) the CNN learns the on-going design and provides a real time alert in case of potential failure, i.e., reliability violation. The system quickly learns and adapts to IC layout characteristics during its inception. The system reaches instantaneous conclusions based on its analysis and informs the designer to make the changes.

Once a polygon is identified, analyzed, and classified, similar ones will be quickly identified using successive completion features, even if the polygon is not identical to previous ones. The AI system focuses on similar and different features. The algorithm works incrementally, i.e., processing differences and variations as the IC layout is designed. One of the key factors to achieve a real time response is the fact that the system needs to analyze only the constant added/modified polygons. It is the first of its kind to actually learn the IC layout over time, exactly as we humans do while designing it.

In operation, a layout designer or other user of disclosed systems and methods may employ an electromigration-self heat aware (EMSH Aware) tool that prevents electromigration and self-heat violations from being created during the construction of a mask layout block. The processing instructions may include a commercially available layout editor interfaced with the EMSH Aware tool. A layout designer may move a cursor or click on a polygon to select it. The EMSH Aware tool provides the ability to analyze the width, length and placement of polygons in a mask layout block and determine if an electromigration and/or self-heat violation is created. The EMSH Aware tool highlights a violation marker that may represent a width, space, or length in the layout block to eliminate electromigration and self-heat violations according to a technology or external constraints file.

In addition, an exemplary EMSH Aware tool provides an information window with the current and required electromigration and self-heat conditions related to the selected polygon. The information window includes an option to perform an automatic correction of the selected polygon, which also can be done by a Right-Click of the mouse. With the activation of the correction action on the polygon, the system will change the selected polygon width, length or space according to electromigration and self-heat rules, thereby maintaining the process design rules (DRC Clean) and layout connectivity (LVS Clean) correctness.

In addition, the EMSH Aware tool may provide the ability to analyze the number of contacts and VIA's, determine the amount needed to comply with electromigration and self-heat rules. In case of contacts or VIAs individual or multiple selections, the system automatically adjusts the number of contacts or vias according to electromigration and self-heat rules. The mask layout block, therefore, may be created free of electromigration and self-heat violations.

Figure 17A:
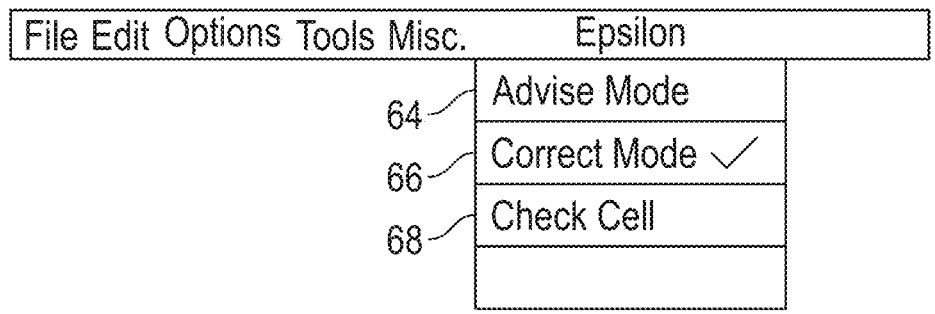
FIGS. 17A and 17B are front views of an exemplary embodiment of an EMSH Aware tool in accordance with the present disclosure.
Figure 17B:
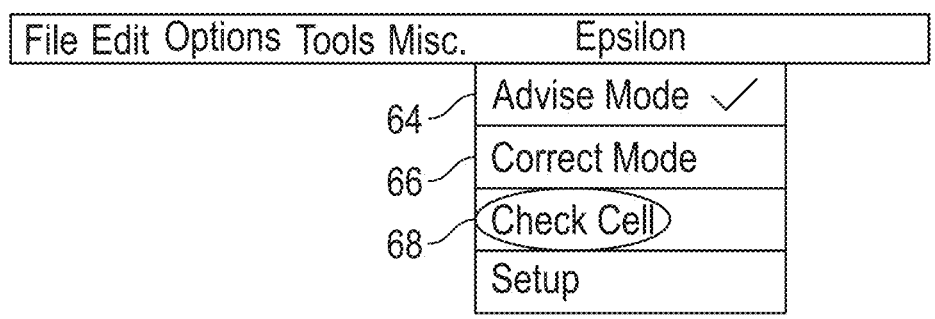

As shown in FIGS. 17A and 17B, the EMSH Aware tool 62 may be operated in two different modes: an Advise mode 64 and a Correct mode 66. When operating in the Advise mode 64, the tool provides visual markers and a report about an EMSH violation. More particularly, in Advise mode 64 the EMSH Aware tool 62 may graphically display a violation marker which shows the required width, length or space of the selected polygon without violating any electromigration and/or self-heat or design rules included in a technology and/or external constraints file.

Figure 18A:
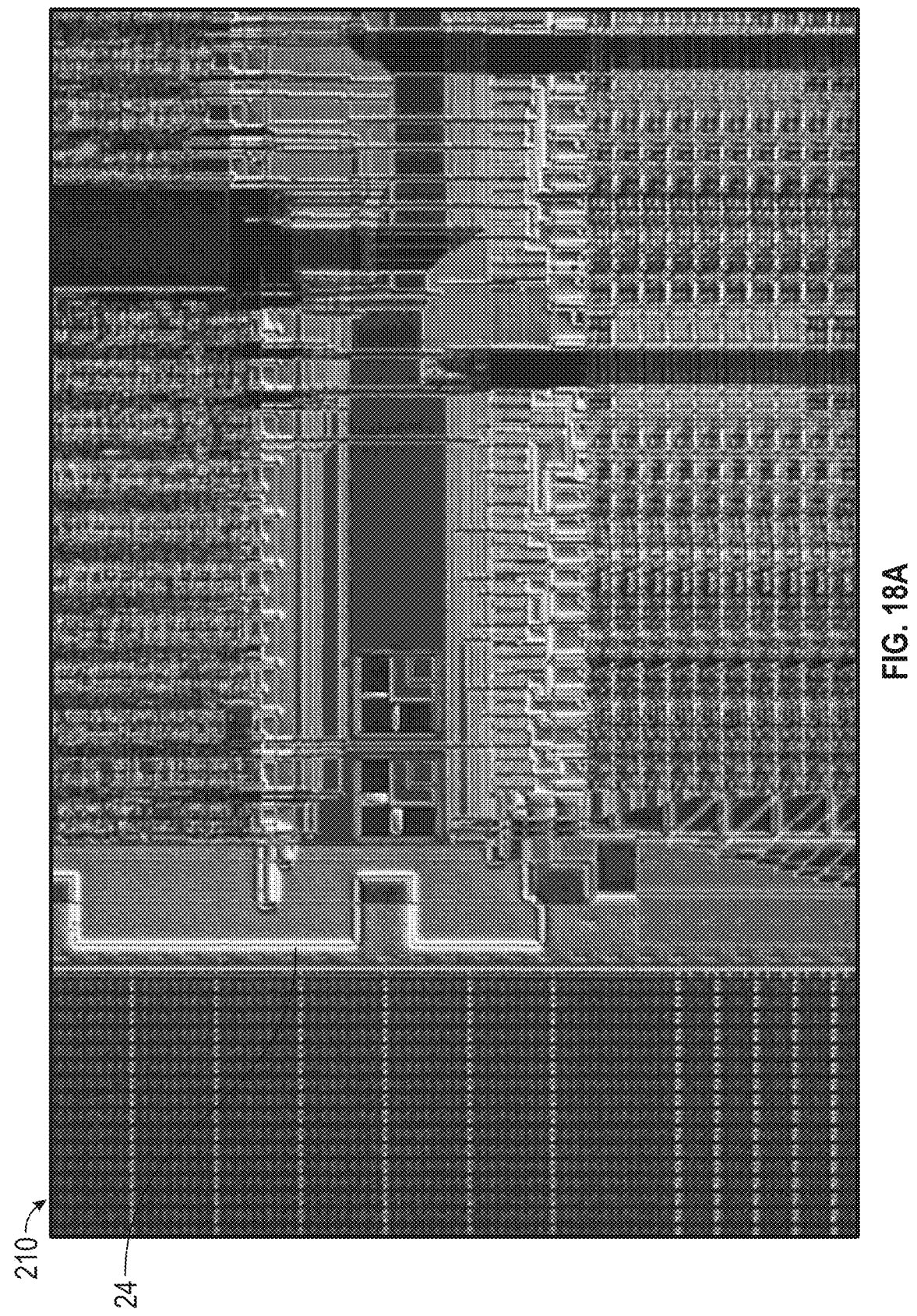
FIGS. 18A and 18B are detail views of NETS with exemplary embodiments of EMSH tool violation markers in accordance with the present disclosure.
Figure 18B:
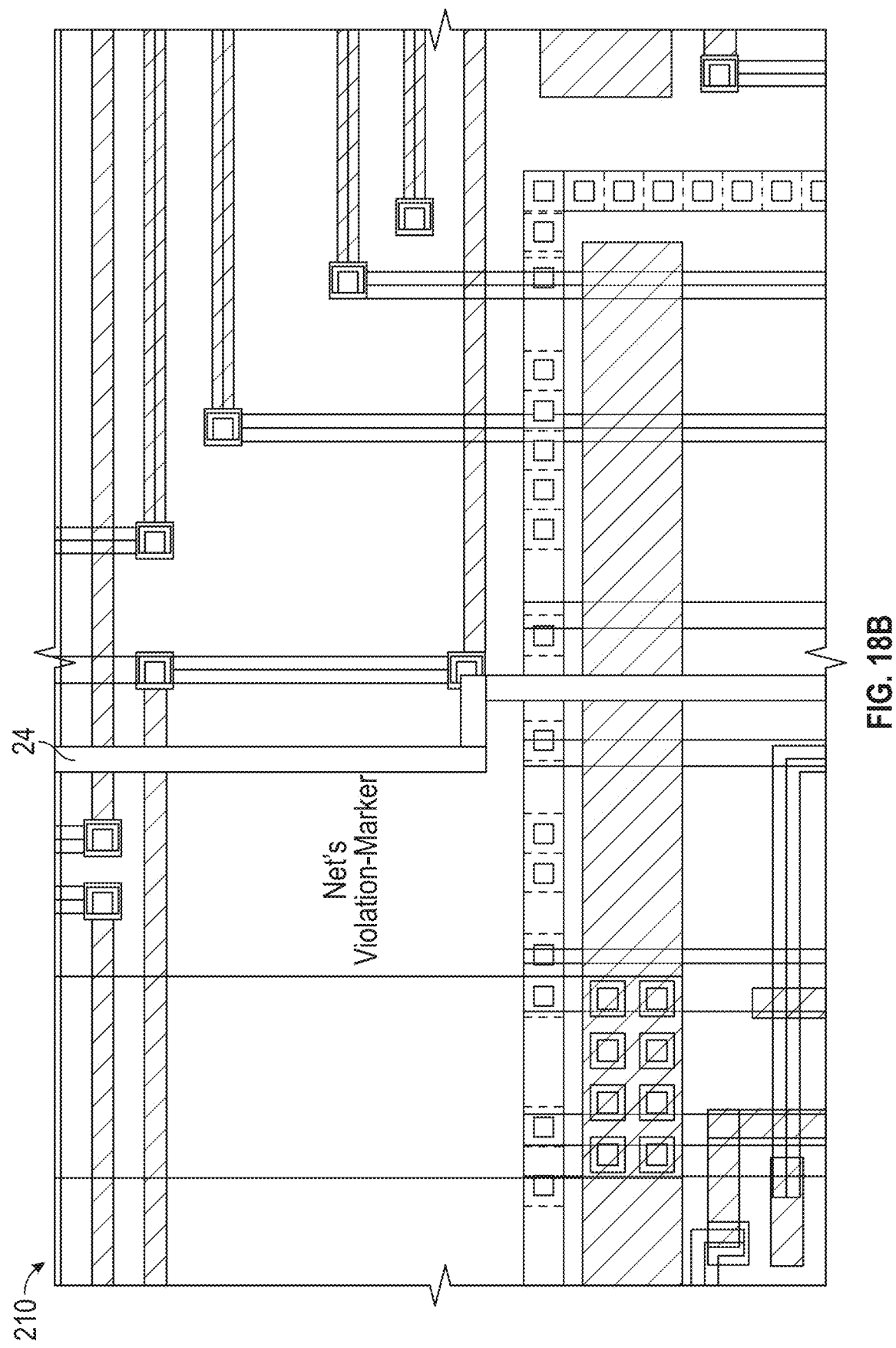
Figure 19:
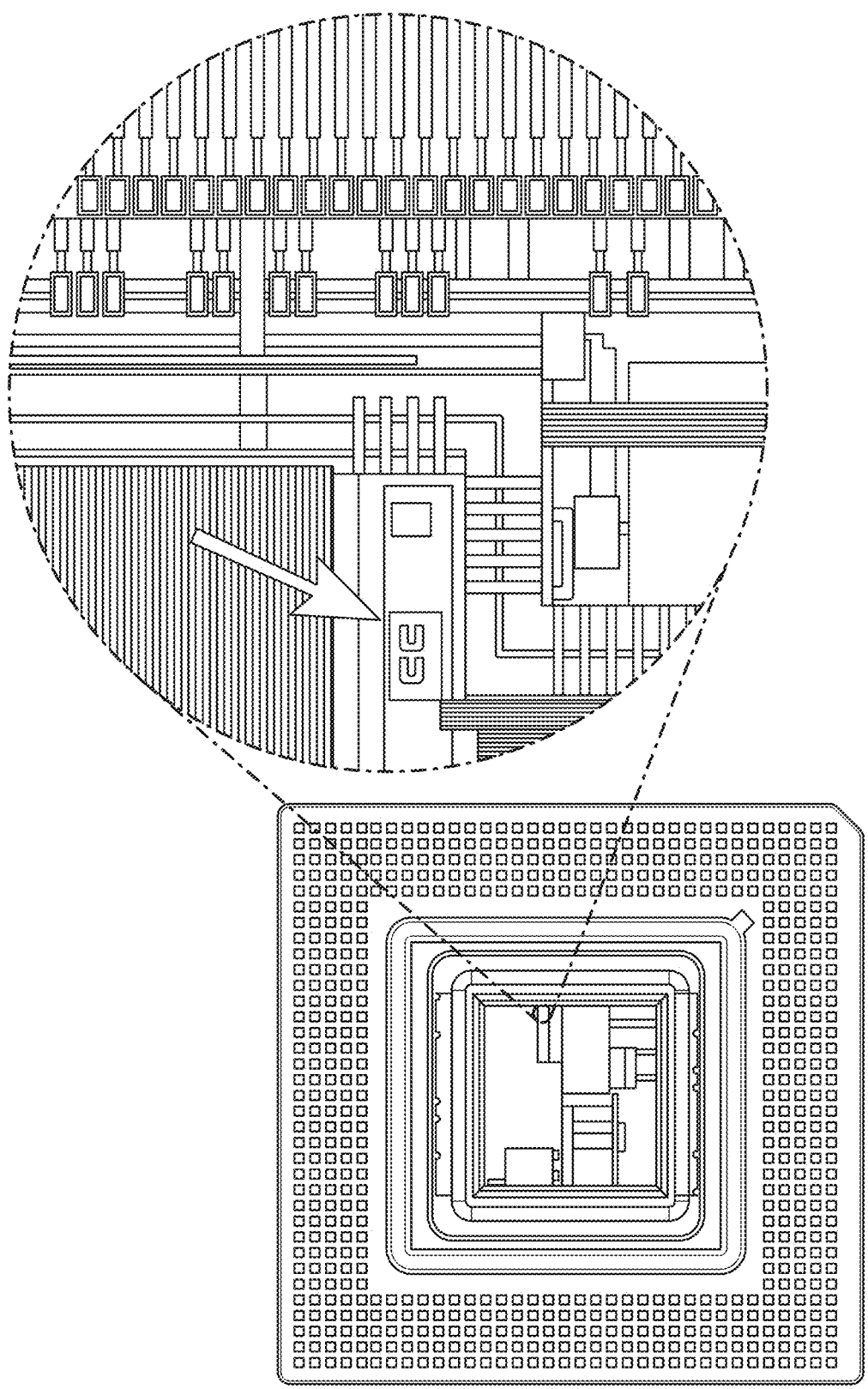
FIG. 19 is a detail view of a NET showing reliability violations in accordance with the present disclosure.

In the Correct mode 66, the EMSH Aware tool 62 offers the option to automatically fix the violation. More particularly, the tool may prevent or adjust the creation, placement, or editing of polygons to eliminate electromigration and/or self-heat and design rule violation. The Advise and Correct modes 64, 66 work interactively. This means as the designer assembles the chip's layout the system analyzes in the background, watching over each move of the designer. If a violation is made, the violation markers 24 are placed visually so the designer can see that a violation was made. A NET 210 with an EMSH violation marker 24 can be seen in FIGS. 18A and 18B. This may be similar to the RED highlight in Microsoft word spell check. In the Correct mode 66, the tool will automatically fix the violation. FIG. 19 shows a detail view of a NET's reliability violations within a microchip layout.

When a layout designer creates a mask layout block, the EMSH Aware tool reads a technology and/or external constraints file corresponding to a desired manufacturing process. The technology file may contain design rules for the desired manufacturing process that ensures an integrated circuit fabricated on a semiconductor wafer functions correctly. In addition, the technology file may contain electromigration and self-heat rules to ensure reliable integrated circuit operation for the desired time period.

Furthermore, an exemplary EMSH Aware tool 62 has an option to read another constraints file which contains layout extraction information (resistance and capacitance values) per circuit net. Within the mask layout block, the electromigration and self-heat rules may define the minimum or maximum allowable feature dimensions (e.g., metal and polysilicons wires width, spaces and length) for the desired manufacturing process. The EMSH Aware tool 62 then uses the electromigration and self-heat rules to prevent the layout designer from creating electromigration and self-heat violations during the construction of the mask layout block.

If the layout designer chooses to operate in Advise mode 64, the layout designer may select a polygon by moving a cursor over the desired polygon or selecting it. The EMSH Aware tool 62 uses the electromigration and self-heat rules to graphically display the required length, width or space through a violation marker, within the mask layout block where the layout designer may move, place, create or edit a polygon. If the layout designer selects, creates or moves contacts or VIA's the EMSH Aware tool may graphically guide for the number, location and space of the contacts or VIA's, thereby maintaining the process design rules (DRC Clean) and layout connectivity (LVS Clean) correctness.

In exemplary embodiments, the EMSH Aware tool graphically represents the violation marker in the mask layout block by highlighting the required width, length or space with an appropriate color and/or pattern. The violation marker color and/or pattern can be set in an initial tool setup. In addition, the EMSH Aware tool may show an Information Window with the current and required conditions. The Information Window also provides with the option to correct the violation.

If the layout designer chooses to operate in Correct mode, the EMSH Aware tool may prevent the layout designer from creating, placing, or editing a polygon in a position within the mask layout block that will cause an electromigration and/or self-heat violation. If the layout designer attempts to create a polygon in a certain width or length that does not comply with the electromigration and/or self-heat requirements, the EMSH Aware tool automatically adjusts the polygon to the correct width or length size.

In another example, if the layout designer is stretching a metal polygon's edge, the EMSH Aware tool automatically stretches the edge to the required length to comply with electromigration and/or self-heat rule. In addition, if the layout designer places a certain number of VIAs on a connection area between Metal 3 and Metal 4 polygons, the EMSH Aware tool automatically adjusts the amount and location of the VIAs to meet electromigration and/or self-heat rules. The VIAs that will be placed maintain design rule correctness regarding distance, width, length and metal coverage.

Both Advise and Correct modes operate in flat mode and hierarchical mode. When a layout designer chooses to work in hierarchical mode, the EMSH Aware tool will graphically guide about electromigration and self-heat violations throughout the hierarchy in Advise mode. An exemplary EMSH Aware tool will enforce electromigration and self-heat violation elimination throughout the hierarchy in Correct mode.

Referring again to FIGS. 17A and 17B, exemplary embodiments of an EMSH Aware tool includes an entire layout block Check cell mode 68. This mode is aimed to be activated with the completion of the entire layout block. Using this feature the entire block will be analyzed for electromigration and self-heat violations. When analysis is complete, all violations will be shown using violation markers. This mode operates in flat or fully hierarchical mode.

More particularly, the "CHECK" feature 68 is aimed for a batch mode, analysis of the complete block. The CHECK feature 68 processes the entire block and highlights all violations. The block can be completed or partially completed. After finding all violations (if any exist) the designer has the option to click on "FIX" and the tool will go over all violations and fix the violations. For example, it will widen wires, add more VIAS, etc. BATCH mode is not interactive but a process by itself. For a large chip it can run for example for an hour. Advantageously, even if some violations were made during construction, it will catch them and the designer will have the option to fix them automatically or manually if desired.

Thus, it is seen that systems and methods for eliminating electromigration and/or self-heat violations during construction of a mask layout block and maintaining the process design rules (DRC Clean) and layout connectivity (LVS Clean) correctness are provided. It should be understood that any of the foregoing configurations and specialized components or connections may be interchangeably used with any of the systems of the preceding embodiments. Although illustrative embodiments are described hereinabove, it will be evident to one skilled in the art that various changes and modifications may be made therein without departing from the scope of the disclosure. It is intended in the appended claims to cover all such changes and modifications that fall within the true spirit and scope of the present disclosure.

What is claimed is:

1. A computer-implemented method for eliminating electromigration and self-heat violations during construction of a mask layout block, comprising:
   analyzing a selected polygon including scanning an entire selected polygon within boundaries of the selected polygon by taking a tracking step in a tracking direction and taking a width run across a width of the selected polygon;
   determining a selected position of the selected polygon;
   obtaining one or more electromigration rules or self-heat rules associated with the selected polygon;
   providing an information window with the one or more electromigration rules or self-heat rules; and
   providing a violation marker associated with the selected position of the selected polygon, the violation marker preventing creating, placing, and editing the selected polygon if the selected position would violate at least one of the one or more electromigration rules or self-heat rules.

2. The method of claim 1 wherein the one or more electromigration rules or self-heat rules are obtained from one or more of: a technology file or an external constraints file.

3. The method of claim 1 wherein the violation marker graphically represents a characteristic of the selected polygon, the characteristic comprising one or more of:
width, space, and length.

4. The method of claim 1 further comprising analyzing the mask layout block for violations of the one or more electromigration rules or self-heat rules.

5. The method of claim 1 further comprising determining if the selected position contains a number of contact polygons or VIA polygons in compliance with the one or more electromigration rules and self-heat rules.

6. The method of claim 5 further comprising modifying the number of contact polygons or VIA polygons to ensure compliance with the electromigration rules and self-heat rules.

7. The method of claim 1 further comprising determining if the selected position for the selected polygon creates a feature dimension in the mask layout block greater than at least one of the one or more electromigration rules or self-heat rules.

8. The method of claim 7 further comprising modifying the selected position such that the feature dimension is approximately equal to the at least one of the electromigration rules and self-heat rules.

9. A computer-implemented method of improving construction of a mask layout block, comprising:
analyzing a selected polygon and determining a selected position of the selected polygon including detecting intersections between multiple line segments;
providing a violation marker associated with the selected position of the selected polygon;
determining if the selected position of the selected polygon produces a violation of one or more electromigration rules or self-heat rules associated with the selected polygon; and
preventing creating, placing, or editing of the selected polygon at the selected position if the selected position would violate at least one of the one or more electromigration rules or self-heat rules.

10. The method of claim 9 further comprising placing the selected polygon in an original position in the mask layout block if there is a violation of at least one of the one or more electromigration rules or self-heat rules.

11. The method of claim 10 further comprising adjusting a characteristic of the selected polygon, the characteristic comprising one or more of: width, space, and length.

12. The method of claim 10 further comprising adjusting a number of contact polygons or VIA polygons until the violation is eliminated.

13. The method of claim 9 further comprising determining if the selected position produces a violation of at least one of the one or more electromigration rules or self-heat rules in a top-level cell.

14. The method of claim 9 further comprising generating a mask layout file from the mask layout block, the mask layout file being without a violation of at least one of the one or more electromigration rules or self-heat rules.

15. A system for maintaining process design rules and layout connectivity during construction of a mask layout block, comprising:
a processor;
a computer-readable memory;
a polygon analysis module configured to analyze a selected position of a selected polygon in the mask layout block;
a violation marker associated with the selected polygon;
an information window having electromigration rules or self-heat rules; and
a convolutional neural network learning characteristics of the mask layout block;
wherein the system determines if the selected position of the selected polygon or a length or width of the selected polygon violates an electromigration rule or self-heat rule;
wherein the system prevents creation, placement, and editing of the selected polygon at the selected position if the selected position or the length or the width would violate an electromigration rule or a self-heat rule; and
wherein the convolutional neural network identifies additional polygons based on analysis of the selected polygon and provides alerts in case of reliability violations in the additional polygons.

16. The system of claim 15 wherein the mask layout block is hierarchical and includes at least one top-level cell and at least one sub-cell.

17. The system of claim 15 wherein when there is a violation of an electromigration rule or a self-heat rule, the system places the selected polygon in an original position in the mask layout block.

18. The system of claim 15 wherein when there is a violation of an electromigration rule or a self-heat rule, the system adjusts the selected position of the selected polygon until the violation of the electromigration rule or self-heat rule is eliminated.

19. The system of claim 15 wherein when there is a violation of an electromigration rule or a self-heat rule, the system adjusts at least a part of the length or width of the selected polygon until the violation of the electromigration or self-heat rule is eliminated.

20. The system of claim 15 further comprising a technology file or and external constraints file containing the electromigration rules or self-heat rules.

* * * * *